United States Patent [19]
Chouly et al.

[11] Patent Number: 6,038,696
[45] Date of Patent: *Mar. 14, 2000

[54] DIGITAL TRANSMISSION SYSTEM AND METHOD COMPRISING A PRODUCT CODE COMBINED WITH A MULTIDIMENSIONAL MODULATION

[75] Inventors: Antoine Chouly, Paris; David Gianella, Dannemarie, both of France

[73] Assignee: U.S. Philips Corporation, New York, N.Y.

[*] Notice: This patent is subject to a terminal disclaimer.

[21] Appl. No.: 08/987,695

[22] Filed: Dec. 9, 1997

[30] Foreign Application Priority Data

Dec. 10, 1996 [FR] France ................................ 96 15159

[51] Int. Cl.⁷ .................................................. G06F 11/10
[52] U.S. Cl. ......................... 714/786; 714/792; 375/261; 375/265
[58] Field of Search .................................. 714/754, 757, 714/759, 792, 795, 790, 786, 789; 375/341, 265, 261, 263, 244; 379/38

[56] References Cited

U.S. PATENT DOCUMENTS

| | | | |
|---|---|---|---|
| 4,646,305 | 2/1987 | Tretter et al. ............................ | 714/789 |
| 4,807,253 | 2/1989 | Hagenauer et al. ..................... | 375/284 |
| 5,054,036 | 10/1991 | Brownlie et al. ....................... | 375/244 |
| 5,675,590 | 10/1997 | Alamouti ................................ | 714/759 |

OTHER PUBLICATIONS

"Near Shannon limit error–correcting coding and decoding: Turbo–codes (1)" by C. Berrou et al, Proceeding of ICC '93, Geneva, May 1993, pp. 1064–1071.

*Primary Examiner*—Emmanuel L. Moise
*Attorney, Agent, or Firm*—Leroy Eason

[57] ABSTRACT

A digital transmission system wherein the transmitter applies a systematic convolutional code to the input data to generate a product code in blocks, with trellis closure by adding redundant data comprising a parity code bit. The thus coded data are then allocated to symbols that have undergone multidimensional digital modulation. At the receiver, iterative decoding is performed in cascade along two paths by computing hard decision reliabilities for each sub-set of the multidimensional digital modulation so as to produce soft decisions. The second path utilizes the results produced by the first path to form soft decisions. The soft decisions enable determination of output symbols. The invention also relates to a data protection method implemented in such a system.

7 Claims, 9 Drawing Sheets

DIGITAL TRANSMISSION SYSTEM AND METHOD COMPRISING A PRODUCT CODE COMBINED WITH A MULTIDIMENSIONAL MODULATION

RELATED APPLICATION

This invention is related to a concurrently filed application, U.S. application Ser. No. 08/987,694 filed on Dec. 9, 1997, now U.S. Pat. No. 5,944,850, having partly common inventorship herewith and assigned to the same assignee. Such application relates to coding using a punctured product code combined with quarature amplitude modulation.

FIELD OF THE INVENTION

The invention relates to a digital transmission system for protecting input data, comprising coding means for said data and iterative decoding means, the coding means comprising a first sub-set for performing a systematic convolutional trellis coding permitting of the iterative decoding, and a second sub-set for allocating the coded data to digitally modulated symbols.

The invention likewise relates to a method of protecting input data implemented in such a digital transmission system.

The system may be utilized for digital transmission for cable television, satellite television, terrestrial broadcasting, communication over telephone lines or otherwise.

BACKGROUND OF THE INVENTION

Selective protection systems are known which combine convolutional coding with digital modulation. More particularly, for enhancing the performance of such a system in terms of bit error rates, a new class of convolutional codes called turbo codes has been described in the document entitled: "Near Shannon limit error-correcting coding and decoding: Turbo-codes (1), C. BERROU, A. GLAVIEUX, P. THITIMAJSHIMA, Proceeding of ICC '93, Geneva, May 1993, pp. 1064–1071. These turbo codes have a performance, expressed in bit error rates, close to theoretical limits provided by Shannon. They are parallel concatenated convolutional codes. These convolutional codes are based on systematic punctured recursive codes, that is, they are derived from codes of rate ½ with which one input bit gives rise to two output bits, the puncturing being applied to the bits themselves. The concatenation as such is realized by an appropriate interleaving of the data that contain the information.

At the receiver end, the iterative decoding, called turbo decoding, consists of decoding the received symbols several times to improve the performance of the system in terms of bit error rates. The successive iterative decodings are carried out by a single soft-decision Viterbi decoder. This decoder differs from a conventional Viterbi decoder which makes a hard decision. In this document, the soft decisions on the output of the decoder produce a hard-decision reliability ratio, that is, a correct decision likelihood. The decoder is then followed by a deinterleaving of the output data.

However the use of turbo codes followed by an iterative decoding, as disclosed in said documents does not suppress the limitations of punctured systematic codes with codes of rate ½, especially when the latter are applied separately from the digital modulation with which they co-operate. More particularly, a disadvantage of these codes is that they are adapted only to modulations having a low spectral efficiency (less than or equal to two bits/s/Hz), such as the MDP2 and MDP4 phase modulations. A bit rate equal to a maximum of twice the band used corresponds to these codes. For augmenting the rate for a fixed occupied band, one could look for utilizing high spectral efficiency modulations of the quadrature amplitude modulation type (QAM). But the use of the punctured convolutional codes described above, juxtaposed with QAM modulations, does not provide optimum performance, because these codes have been designed irrespective of the modulation.

SUMMARY OF THE INVENTION

In it is an object of the invention to enhance the performance of such digital transmission systems while maintaining a proper functioning of the system with a minimum signal-to-noise ratio while improving their spectral efficiency.

This object is achieved with a digital transmission system in which the first sub-set utilizes a systematic convolutional trellis coding having a coding rate P/(Q.M), where M, P and Q are integers with Q and M being greater than 1, the systematic convolutional code being used for generating a product code in blocks with trellis closure by the addition of redundant data having at least one parity code bit. The product code is formed by components generated by row coding and column coding of a matrix that combines the coded data via the systematic convolutional code. The second sub-set combines the product code with a multidimensional amplitude modulation having dimension Q that has $2^M$ states, the iterative decoding being a block decoding.

For generating the product code and the added redundant data on the basis of systematic convolutional codes, the coding means may comprise a so-called state machine which defines output states, redundancy symbols based on input states and data symbols.

Preferably, the state machine is coupled to a reading table for determining the redundancy symbols of the systematic convolutional code and the symbols used for closing the trellis.

According to the invention, the system is also characterized in that the iterative decoding means comprise at least two paths operating in succession:
  along a first path, the system carried out a first iterative decoding with each iteration of the path with:
    a) computing means for computing hard decisions which relate to the systematic convolutional code,
    b) computing means for computing first reliabilities of the hard decisions associated with each multidimensional modulation sub-set, and second reliabilities associated to the trellis of the systematic convolutional code,
    c) selecting means for selecting minimum reliabilities between the first and second reliabilities of each decision,
    d) computing means for computing soft decisions used for the next iteration of the first path as a function of selected minimum reliabilities and hard decisions,
  and along a second path, the system utilizes for each iteration of the path:
    a) computing means for computing hard decisions which relate to the parity code,
    b) computing means for computing third reliabilities for each hard decision of the second path as a function of hard decisions of the first path,
    c) computing means for computing soft decisions as a function of the third reliabilities, soft decisions coming from the preceding iteration of the second path and hard decisions from the first path.

The invention also relates to an input data protection method utilized in a digital transmission system, the method comprising a coding phase for coding said data and an iterative decoding phase. The coding phase comprises a first systematic convolutional trellis code step which permits of iterative decoding, which step is combined with a second step of allocating coded data to digitally modulated symbols, characterized in that during the first step the systematic trellis coding has a coding rate P/(Q.M), where M, P and Q are integers with Q and M being greater than 1, the systematic convolutional code being used for generating a product code in blocks after trellis closure by the addition of redundant data. The product code is formed by components generated by row coding and column coding of a matrix that combines the coded data via the systematic convolutional code. The second step combines the product code with a multidimensional amplitude modulation dimension Q that has $2^M$ states, the iterative decoding being a block of decoding.

A systematic convolutional coding is discussed here of rate P/(Q.M) preferably a rate ⅞. This coding is combined with a $2^M$-state (preferably 4-state) multidimensional digital modulation to provide optimum performance. According to this example (M=2, Q=8, P=14, rate=14/16=⅞), such a coding is obtained by processing a bit stream in which are taken 14 bits or 7 symbols (called input symbols) to be coded into eight symbols (called output symbols). The Q symbols (the eight output symbols, respectively) select two $2^M$-level symbols (four-level respectively {+1, −1, +3, −3}), that is to say, Q real symbols having the $2^M$-level amplitude modulation with M output bits per symbol (four-level 4-AM respectively, with two output bits per symbol). The product code is realized by applying the systematic convolutional code to the rows and columns of a matrix which contains the information bits with a trellis closure for each row and each column. Subsequently, the $2^M$-AM (for example, 4-AM) symbols coming from the matrix according to the product code are combined in pairs to generate $2^{2M}$-QAM symbols (for example, 16-QAM). The coded data are then transmitted by a carrier according to customary techniques.

For permitting the turbo decoding at the receiver end, the product code must be systematic. Therefore, systematic convolutional codes are to be used, that is to say, after coding the input data symbols occur on the output unchanged.

The convolutional codes of rate P/(Q.M), for example, ⅞, described hereinafter, are designed in such a way that they give the lowest error rate for a given signal-to-noise ratio and this specifically for the 4-AM or 16-QAM modulation.

In this manner, a system is obtained having optimum performance both as regards signal-to-noise ratio and spectral efficiency by the combination of a coder structure which realizes in optimum fashion the systemic convolutional coding with a rate ⅞ with the multidimensional modulation.

According to the invention, actually a product code using a systematic convolutional code is discussed here combined with a quadrature amplitude modulation and not a juxtaposition.

This system has various advantages.

Compared to the prior-art system, which utilizes binary punctured codes with an MDP4 phase modulation, one has a transmission capacity that is twice higher (spectral efficiency between two and four bits/s/Hz).

The system does not have much hardware complexity, because a single soft-decision decoder is necessary for performing the iterative decoding of the product code.

The codes used are preferably systematic convolutional codes of rate ⅞, with 14 input bits and 16 output bits. The function that generates the 16 output bits as a function of the input bits and of the state (memory) of the coder has been optimized in view of the 16-QAM modulation.

The systematic convolutional codes, preferably of rate ⅞ are chosen so that the minimum Euclidian distance of these codes combined with a 16-QAM modulation is maximized for improving the performance. This particularly refers to the combination of the coding and the modulation.

These and other aspects of the invention will be apparent from and elucidated with reference to the embodiments described hereinafter.

DESCRIPTION OF EMBODIMENTS

Figure 1:
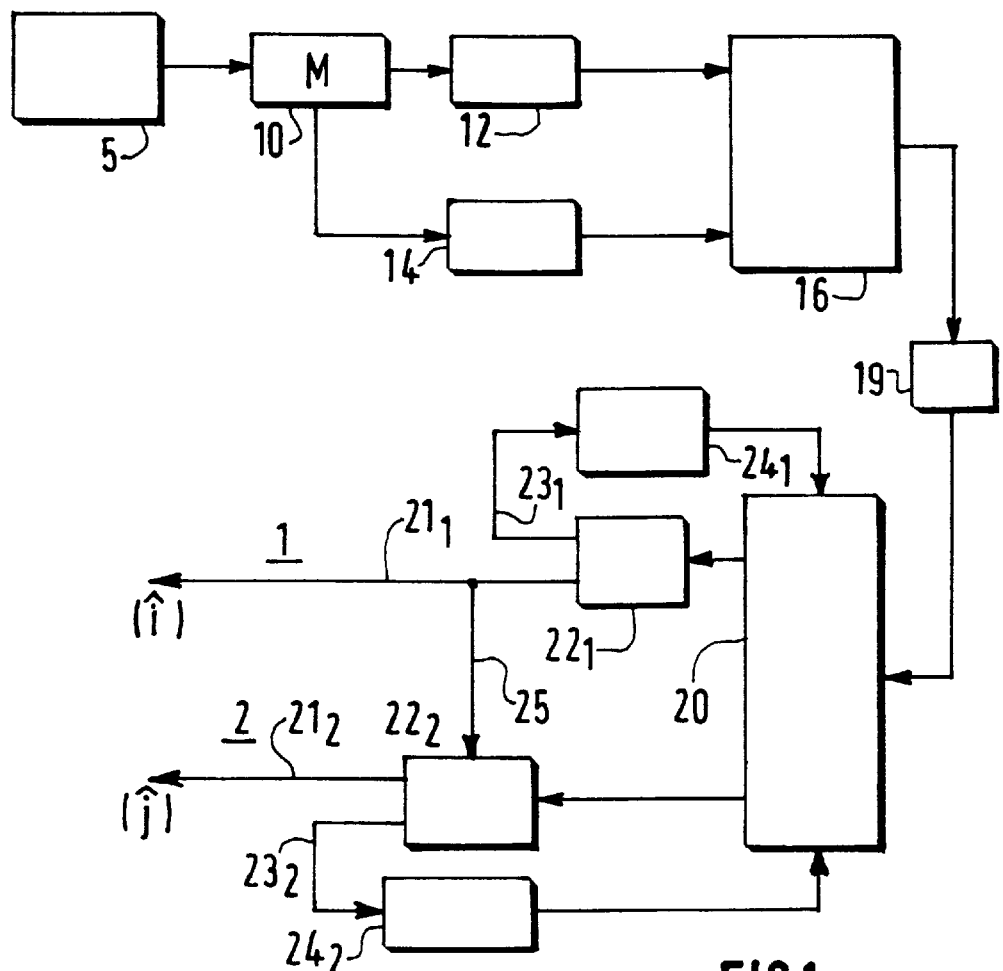
FIG. 1: shows a diagram of a baseband digital transmission system according to the invention.

FIG. 1 represents a diagram of a baseband digital transmission system according to the invention. The input data to be protected coming from a source 5 are organized in a matrix, for example, by storing them in a memory 10 formed by rows and columns which may be addressed separately. The system comprises row coding means 12 and column coding means 14. The two coding means produce data which are allocated to 4-AM digitally modulated symbols. An allocation element 16 transforms the 4-AM symbols into 16-QAM symbols. This is a combination in pairs of the 4-AM symbols.

These symbols are transmitted according to customary techniques over a channel 19 to receiver means. The received data pass through buffer means 20 which permit of performing the loop processing to be described hereinafter. The decoder comprises two paths operating in succession, one path 1 which relates to the decisions about the least-significant bits of the transmitted symbols (index i), and a second path which relates to the decisions of the most-significant bits of the transmitted symbols (index j).

On path 1, on the output of the buffer means 20, the data enter a Viterbi decoder $22_1$ which has two outputs, a hard-decision output $21_1$ which delivers the estimated symbols and the estimated bits i obtained for each iteration, and a soft-decision output $23_1$ which is looped back to the buffer memory 20 through a data interleaver $24_1$.

On path 2, on the output of the buffer means 20, the data enter a parity code decoder $22_2$ which has two outputs, a hard-decision output $21_2$ which delivers the estimated bits j obtained for each iteration, and a soft-decision output $23_2$ which is looped back to the buffer 20 through a data interleaver $24_2$.

The decoding of the path 2 is performed after path 1 has been decoded, based on received symbols and bits i estimated by the decoder of the path 1.

The estimated symbols become more reliable as the iterative processing is repeated. On average, this improvement, measured in error rates, is obtained after 4 or 5 iterations for the path 1 and after 2 or 3 iterations for the path 2.

For forming the product code, the coding of a row of the matrix is carried out by the row coder in the following fashion. The data are processed in blocks, one block comprising $2\times(7N+4)^2$ bits for a systematic code of rate ⅞ taken here by way of example. The memory 10 stores an information matrix [I] of dimension $(7N+4)\times(7N+4)$. The matrix contains quaternary data symbols $\{+1, -1, +3, -3\}$. Each symbol corresponds to 2 bits.

Then, each row of the matrix [I] (1 row=7N+4 symbols) is coded by a systematic convolutional row coder 122 (FIG. 3) generating both the data symbols (which are the 4-AM 4-level symbols $\{+1,-1,+3,-3\}$ corresponding to the quaternary symbols of the matrix [I] before coding) and the redundancy symbols. For each row there are N 4-AM redundancy symbols generated by the convolutional ⅞ coder (N redundancy symbols for 7N data symbols) and 4 4-AM redundancy symbols for closing the code trellis. These 4 symbols are generated with the 4 last symbols of the row of the information matrix. The same operation is carried out for the columns of the matrix.

Consider by way of example the systematic convolutional code of rate ⅞ (coder 122). With 7 useful data symbols are generated 8 symbols comprising the 7 useful symbols (systematic convolutional code) plus one redundancy symbol. Consider the first row of the matrix formed by N+1 blocks (one block having 7 data symbols, that is, 14 bits) which are:

$(I_{1,1}, \ldots I_{1,7})$, $(I_{1,8}, \ldots I_{1,14})$, $\ldots$, $(I_{1,7N-6} \ldots I_{1,7N})$, $(I_{1,7N+1}, \ldots I_{1,7N+4})$.

A symbol, for example, $I_{1,1}$, comprises two bits $j_{1,1}$ and $i_{1,1}$.

Figure 3:
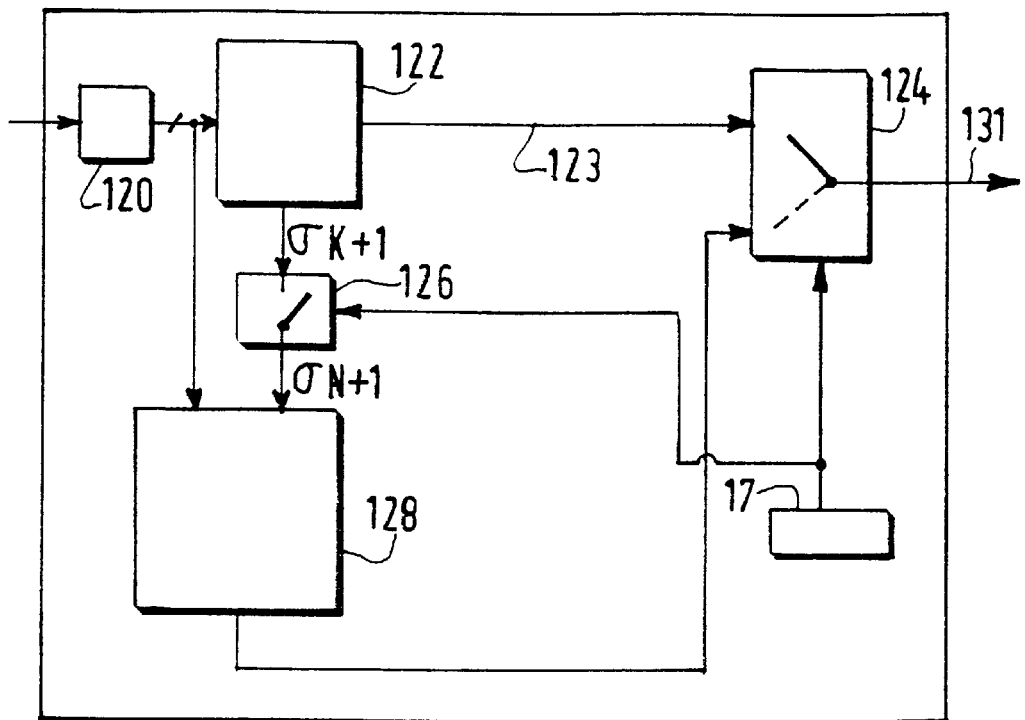
FIG. 3: shows a general circuit diagram of a row or column coder permitting of generating the product code.

The product code realized according to the diagram of FIG. 3, gives a matrix represented in Table I.

TABLE I

| | | |
|---|---|---|
| $I_{1,1} \ldots I_{1,7N+4}$ | $R_{1,1} \ldots R_{1,N}$ | $TR_{1,1} \ldots TR_{1,4}$ |
| ..... | ..... | ..... |
| $I_{m,1} \ldots I_{m,7N+4}$ | $R_{m,1} \ldots R_{m,N}$ | $TR_{m,1} \ldots TR_{m,4}$ |
| ..... | ..... | ..... |
| $I_{7N+4,1} \ldots I_{7N+4,7N+4}$ | $R_{7N+4,1} \ldots R_{7N+4,N}$ | $TR_{7N+4,1} \ldots TR_{7N+4,4}$ |
| ..... | ..... | ..... |
| $C_{1,1} \ldots C_{1,7N+4}$ | | |
| ..... | ..... | ..... |
| $C_{m,1} \ldots C_{m,7N+4}$ | | |
| ..... | ..... | ..... |
| $C_{N,1} \ldots C_{N,7N+4}$ | | |
| ..... | ..... | ..... |
| $TC_{1,1} \ldots TC_{1,7N+4}$ | | |
| ..... | ..... | ..... |
| $TC_{4,1} \ldots TC_{4,7N+4}$ | | |

For each block is computed the redundancy symbol (that is, 2bits) of the systematic convolutional code, block 1 produces $R_{1,1}$, block 2 produces $R_{1,2}$ and so on and so forth up to block N which produces $R_{1,N}$.

There is supposed that the initial state of the coder is equal to zero. After generating $R_{1,N}$, the coder 122 is in state $\sigma(N)$. With the aide of the trellis closing means 128, the trellis is closed by forcing the state of the trellis to zero by generating 4 symbols $TR_{1,1}$, $TR_{1,2}$, $TR_{1,3}$, $TR_{1,4}$ (for an 8-state code) corresponding to a transition in the trellis of the 8-state convolutional code, so that after this transition one arrives at the state $\sigma=0$. For a code having more states, it is necessary to use more trellis closing symbols. The symbols $TR_{1,1}$, $TR_{1,2}$, $TR_{1,3}$, $TR_{1,4}$ are functions of the 4 data symbols $(I_{1,7N+1}, \ldots I_{1,7N+4})$ and of the state of the trellis $\sigma(N)$ after a row has been coded and are generated by a Table addressed by $\sigma(N)$ described hereinafter.

After the coding, the matrix of 4-AM symbols represented in Table I is obtained in which:

$I_{m,n}$ is a matrix having dimensions $(7N+4)\times(7N+4)$ comprising the 4-AM data symbols.

$R_{m,n}$ is a matrix having dimensions $(7N+4)\times N$ comprising the 4-AM symbols that correspond to the row redundancy symbols generated by the ⅞ code.

$TR_{m,n}$ is a matrix having dimensions $(7N+4)\times 4$ comprising the 4-AM trellis closing row redundancy symbols.

$C_{m,n}$ is a matrix having dimensions $(N\times 7N+4)$ comprising the column redundancy symbols.

$TC_{m,n}$ is a matrix having dimensions $(4\times 7N+4)$ comprising the trellis closing column redundancy symbols.

The row coder 12 operates in the following manner (FIG. 3). The input symbols $I_{m,n}$ enter the buffer 120 and then the coder 122 of rate ⅞ which produces one redundancy symbol for a block of 7 data symbols. A multiplexer 124 serializes the symbols on the output. Therefore, it supplies on its output 131, in sequence, groups of 8 symbols while each group is formed by the 7 data symbols and the redundancy symbol corresponding to this block. The multiplexer then supplies all the groups of 8 symbols in succession. When all the groups have been extracted, the 4 last data symbols of the row are extracted and then the 4 trellis closing symbols produced by the element 128 for determining closing symbols. A controller 17 controls the operations.

The same process is carried out for the other rows. In like manner, a similar process is realized for the columns (column coder 14). The first block of the first column is formed by the symbols: $I_{1,1}, I_{2,1} \ldots I_{7N+4,1}$. One redundancy symbol corresponds to each block of 7 symbols, for example, the symbol $C_{1,1}$ corresponds to the first block and the symbol $C_{N,1}$ corresponds to the last block. The trellis closing redundancy symbols for the first column are the symbols $TC_{1,1}$, $TC_{2,1}$, $TC_{3,1}$, $TC_{4,1}$ generated on the basis of the symbols $I_{7N+1,1}, \ldots, I_{7N+4,1}$. All the data formed by the initial-data symbols, the row coding redundancy symbols and the column coding redundancy symbols and the trellis closing symbols form the product code.

One row of this product code forms a block of symbols which is used for coding 4-AM modulation symbols. As the initial-data symbols remain the same in the product code whether they are read in rows or in columns, for utilizing the columns of the product code it is needless to use the initial-data symbols once again. Thus only the redundancy symbols of the columns of the product code are used for coding (column coder 14) 4-AM modulation symbols. The 4-AM symbols coming from the rows and columns of the product code are used for coding a 16-QAM modulation in the allocation element 16.

For enhancing the performance of the system it is possible to code also the redundancy symbols which have just been computed.

In this manner, the columns of the matrices $R_{m,n}$ and $TR_{m,n}$ (row redundancy column coding) may be coder for generating the matrices $RC_{m,n}$, $TRC_{m,n}$, $RCT_{m,n}$ and $TRCT_{m,n}$ having dimensions (N×N), (N×4), (4×N) and (4×4), respectively (Table II). Also coded in rows is the column redundancy (matrices $C_{m,n}$ and $TC_{m,n}$) for generating the matrices $CR_{m,n}$, $CRT_{m,n}$, $TCR_{m,n}$ and $TCRT_{m,n}$ having dimensions (N×N), (N×4), (4×N) and (4×4), respectively.

In this case, the information matrix having dimensions (7N+4)×(7N+4) following the rows and columns for obtaining the row redundancy (symbols $R_{m,n}$ and $TR_{m,n}$) and the column redundancy (symbols $C_{m,n}$ and $TC_{m,n}$) in the same manner as that which has just been described. Then the row redundancy is coded in a column and the column redundancy is coded in a row in order to enhance the performance of the system. Thus, for example, the block of 7N+4 symbols $(R_{1,1}, \ldots, R_{7N+4,1})$ is coded to generate first the N column redundancy symbols $(RC_{1,1}, \ldots, RC_{N,1})$ coming from the ⅞ code redundancy and then the four redundancy symbols $(RCT_{1,1}$ to $RCT_{4,1})$ for closing the trellis. The same is carried out for the other columns of the row redundancy $(R_{1,n}, \ldots, T_{7N+4,n})$ for n=1, . . . , N for the redundancy are coded, that is, the rows $(C_{m,1}, \ldots, C_{m,7N+4})$ for m=1, . . . ,N and the 4 rows $(TC_{1,1}, \ldots, TC_{1,7N+4})$ up to $(TC_{4,1}, \ldots, TC_{4,7N+4})$.

Thus the following matrix is obtained:

TABLE II

| $I_{1,1} \ldots I_{1,n} \ldots I_{1,7N+4}$ | $R_{1,1} \ldots R_{1,N}$ | $TR_{1,1}, \ldots TR_{1,4}$ |
|---|---|---|
| ....... | ....... | ....... |
| $I_{m,1} \ldots I_{m,n} \ldots I_{m,7N+4}$ | $R_{m,1} \ldots R_{m,N}$ | $TR_{m,1}, \ldots TR_{m,4}$ |
| ....... | ....... | ....... |
| $I_{7N+4,1} \ldots I_{7N+4,n} I_{7N+4,7N+4}$ | $R_{7N+4,1} \ldots R_{7N+4,N}$ | $TR_{7N+4,1}, \ldots TR_{7N+4,4}$ |
| ....... | ....... | ....... |
| $C_{1,1} \ldots C_{1,n} C_{1,7N+4}$ | $RC_{1,1} \ldots RC_{1,N}$ | $TRC_{1,1}, \ldots TRC_{1,4}$ |
| ....... | ....... | ....... |
| $C_{N,1} \ldots C_{N,n} C_{N,7N+4}$ | $RC_{N,1} \ldots RC_{N,N}$ | $TRC_{N,1} \ldots TRC_{N,4}$ |
| ....... | ....... | ....... |
| $TC_{1,1} \ldots TC_{1,n} \ldots TC_{1,7N+4}$ | $RCT_{1,1} \ldots RCT_{1,N}$ | $TRCT_{1,1}, \ldots TRCT_{1,4}$ |
| ....... | ....... | ....... |
| $TC_{4,1} \ldots TC_{4,n} \ldots TC_{4,7N+4}$ | $RCT_{4,1} \ldots RCT_{4,N}$ | $TRCT_{4,1}, \ldots TRCT_{4,4}$ |
| ....... | ....... | |
| | $CR_{1,1} \ldots CR_{1,N}$ | $CRT_{1,1}, CRT_{1,4}$ |
| ....... | ....... | |
| | $CR_{N,1} \ldots CR_{N,N}$ | $CRT_{N,1}, \ldots CRT_{N,4}$ |
| ....... | ....... | |
| | $TCR_{1,1} \ldots TCR_{1,N}$ | $TCRT_{1,1}, \ldots TCRT_{1,4}$ |
| ....... | ....... | |
| | $TCR_{4,1} \ldots TCR_{4,N}$ | $TCRT_{4,1}, \ldots TCRT_{4,4}$ |

In this Table:
the matrix [I] contains the input data symbols,
the matrix [R] is the row redundancy matrix of the matrix [I],
the matrix [C] is the column redundancy matrix of the matrix [I],
the matrix [TR] is the trellis closing redundancy matrix for the rows of the matrix [I],
the matrix [TC] is the trellis closing redundancy matrix for the columns of the matrix [I],
the matrix [RC] is the column redundancy matrix of the matrix [R],
the matrix [CR] is the row redundancy matrix of the matrix [C],
the matrix [TCR] is the row redundancy matrix of the matrix [TC],
the matrix [RCT] is the trellis closing redundancy matrix for the columns of the matrix [R],
the matrix [TRC] is the column redundancy matrix of the matrix [TR],
the matrix [TRCT] is the trellis closure matrix for the columns of the matrix [TR],
the matrix [CRT] is the trellis closure matrix of the rows of the matrix [C],
the matrix [TCRT] is the trellis closure matrix of the row coding of the matrix [TC].

Consider in more detail the operation of the row coder 12 represented in FIG. 3 for coding a row of the matrix.

In the buffer 120 is stored the row one wishes to code. One row comprises (14N+8) bits or (7N+4) quaternary data symbols. For example, for the block of the $k^{th}$ order, the buffer stores N blocks $(i_1(k), j_1(k), \ldots, i_7(k), j_7(k))$ having 14 bits (that is, 7 symbols) and 1 block of 8 bits (that is 4 symbols):

$i_1(N+1), i_1(N+1)$
$i_2(N+1), i_2(N+1)$
$i_3(N+1), i_3(N+1)$
$i_5(N+1), i_5(N+1)$

The N blocks of 14 bits are successively subjected to a systematic convolutional coding of rate ⅞ (coder 122). For each block ($k^{th}$ block), the coder 122 generates 7 4-AM data symbols $U_1(k)$ to $U_7(k)$ which corresponds to 14 information bits of the block and 1 redundancy symbol $U_8(k)$, for k=1, . . . ,N, (connection 123) by realizing a bit allocation described in FIG. 8.

Each block of 14 information bits corresponds to a transition in the ⅞-code trellis. The last block of the $N+1^{th}$ order corresponds to the transition that closes the trellis.

Figure 8:
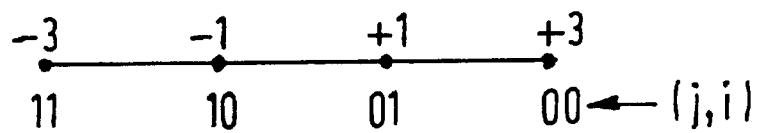
FIG. 8: gives a representation of the bit allocation of the 4-AM symbols.

Based on the 8 information bits $\{i_1(N+1), j_1(N+1), i_2(N+1), j_2(N+1), i_3(N+1), j_3(N+1), i_5(N+1), j_5(N+1)\}$, (4 quaternary symbols) which are the 8 last bits of the row, the 4-AM symbols are generated, that is, $U_1(N+1)$, $U_2(N+1)$, $U_3(N+1)$, $U_5(N+1)$ just like the bit allocation given by FIG. 8, after which the 4 redundancy symbols $U_4(N+1)$, $U_6(N+1)$, $U_7(N+1)$ and $U_8(N+1)$ are computed, permitting of closing the trellis. These symbols are both a function of the state of the coder $\sigma_{N+1}$ after the coding of the $N^{th}$ block and of the 8 bits $\{i_1(N+1), j_1(N+1), i_2(N+1), j_2(N+1), i_3(N+1), j_3(N+1), i_5(N+1), j_5(N+1)\}$. They are determined by element 128.

The column coder is the same except on the output of the systematic convolutional ⅞ coding where they are only the redundancy symbols.

Figure 4:
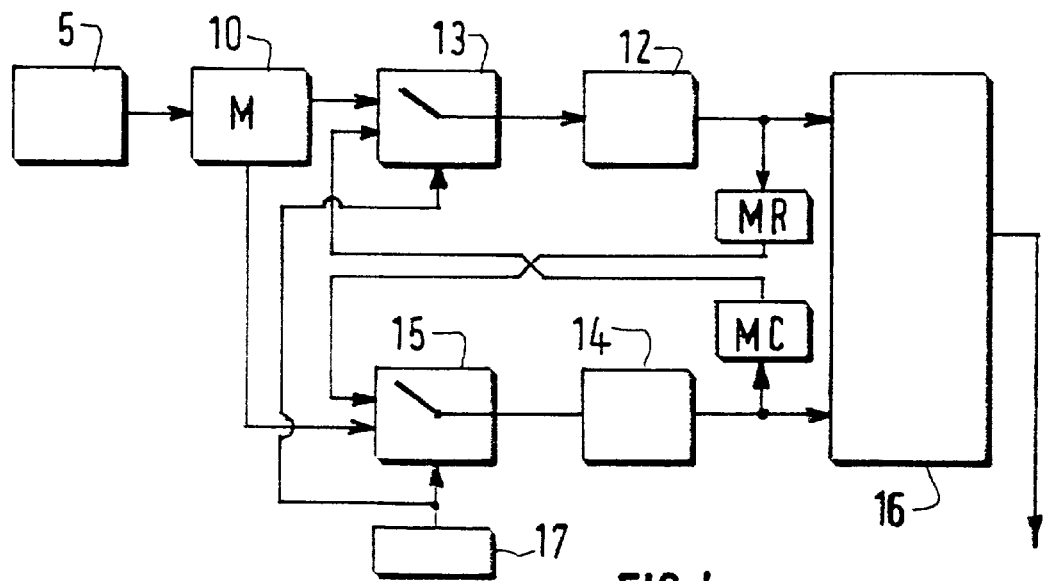
FIG. 4: shows a diagram of a digital transmission system comprising a coder for coding also the redundancy symbols.

The diagram of the coder which permits to make the double coding of the redundancy is represented in FIG. 4. Like elements to those of FIG. 1 are represented having like references. In the case of the example under consideration, the memory M 10 contains $(7N+4)^2$ symbols. Another memory MR contains the $(7N+4)(N+4)$ row redundancy symbols (symbols $R_{m,n}$, $TR_{m,n}$). Another memory MC contains the $(N+4)(7N+4)$ column redundancy symbols (symbols $C_{m,n}$ and $TC_{m,n}$). The memories MR and MC are loaded after finishing the row and column coding of M. Then, the coding of the contents of MR is performed following the columns and the coding of the contents of MC following the rows for generating the $(N+4)^2$ 4-AM symbols ($RC_{m,n}$, $TRC_{m,n}$, $RCT_{m,n}$ and $TRCT_{m,n}$) and the $(N+4)^2$ 4-AM symbols ($CR_{m,n}$, $CRT_{m,n}$, $TCR_{m,n}$, and $TCRT_{m,n}$), respectively. Switches 13 and 15 ensure the running of the operations under the control of the controller 17.

Finally, all the 4-AM symbols formed for each product code matrix of the Tables I or II are combined to pairs and transmitted over the channel in the form of complex symbols of the 16-QAM constellation (in a well-defined order).

The rate of the product code without redundancy coding is equal to:

$$\rho_1 = \frac{(7N+4)^2}{(7N+4)^2 + 2(7N^2 + 32N + 16)}.$$

For N=20, the rate is 0.765 and the spectral efficiency is thus equal to 4 times this rate, that is, 3.06 bits/s/Hz.

With a double redundancy coding, the rate of the product code becomes equal to:

$$\rho_2 = \frac{(7N+4)^2}{16(N+4)(N+1) + (7N+4)^2}.$$

Thus, with N=20, a rate 0.72 is obtained and a spectral efficiency of 2.88 bits/s/Hz. There is a loss of spectral efficiency when coding the redundancy of 0.18 bits/s/Hz, but the performance of the system is enhanced.

FIG. 8 represents the bit allocation of the bits i,j to the symbols of the 4-AM constellation.

Figure 2:
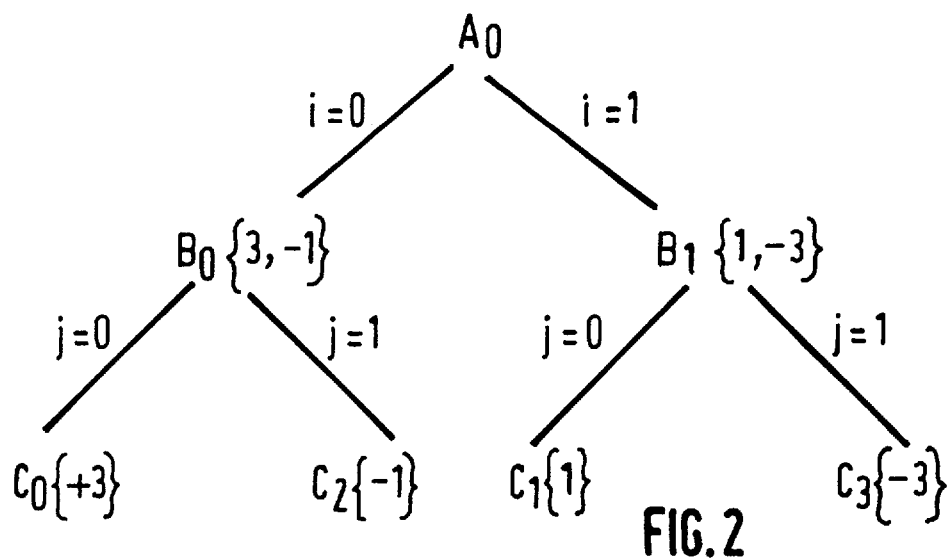
FIG. 2: shows a tree $A_0$ partitioned into sub-sets.

The 4-AM constellation having a 1-D dimension is represented by the set $A_0=\{-3,-1,+1,+3\}$. The first partition level of $A_0$ comprises two sub-sets $B_0$ and $B_1$ with $B_0=\{3,-1\}$ and $B_1=\{1,-3\}$ (FIG. 2). A symbol, for example $I_{1,1}$ comprises two bits $i_{1,1}$ and $j_{1,1}$. The bit i is allocated to this first level with i=0 for $B_0$ and i=1 for $B_1$.

The second partition level of $A_0$ comprises four sub-sets $C_0$, $C_1$, $C_2$ and $C_3$, with $C_0=\{+3\}$, $C_1=\{+1\}$, $C_2=\{-1\}$ and $C_3=\{-3\}$. The index j is allocated to this second level, with j=0 for $C_0$ or $C_1$ and j=1 for $C_2$ or $C_3$. The index of the sets C is equal to the decimal value of the indices j,i, that is, 2j+i, allocated to the partition generating them.

Figure 5:
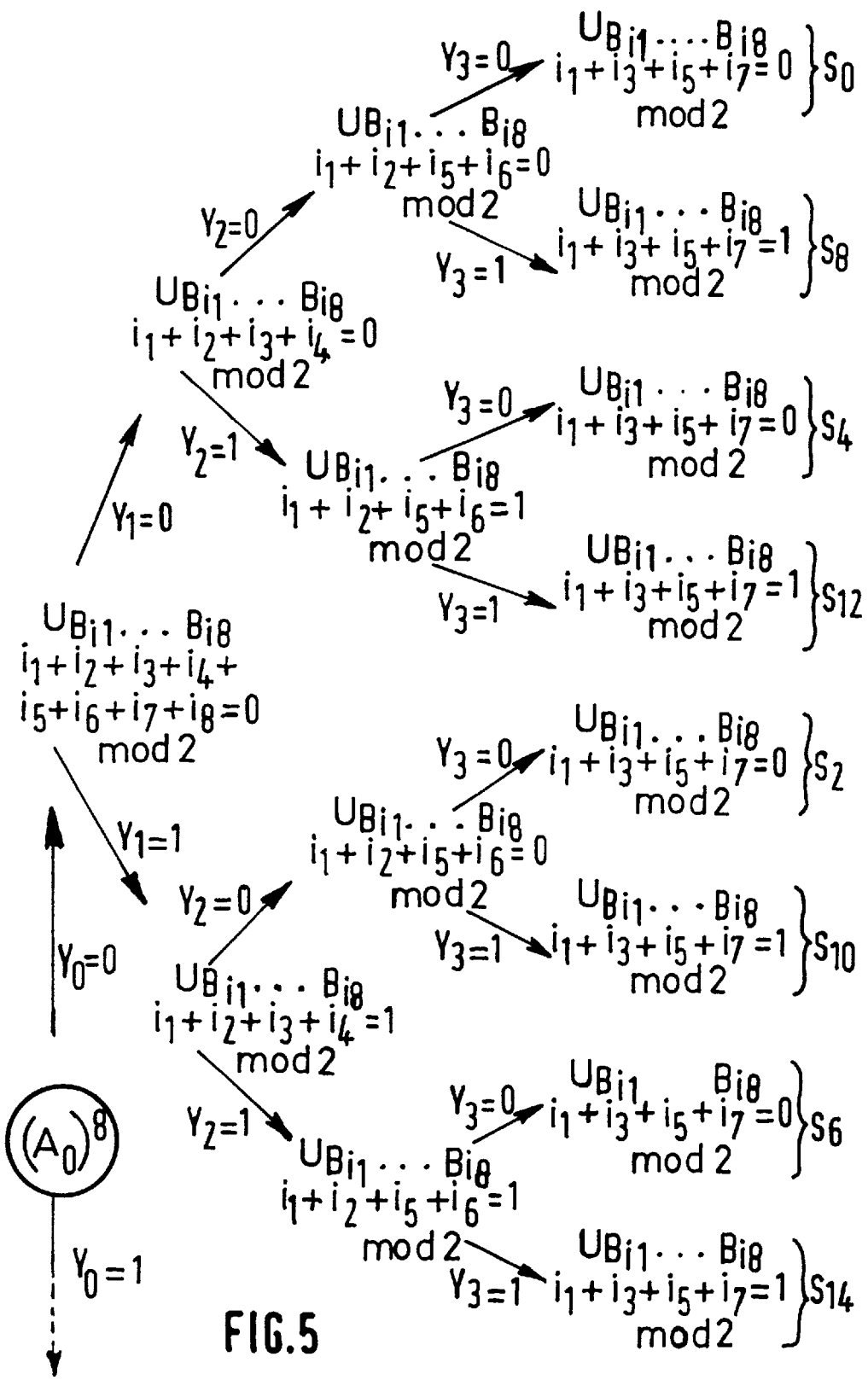
FIG. 5: gives a representation of the partitioned tree of the 8-D constellation.

An 8-D constellation is defined as being the set of the blocks of 8 symbols belonging each to $A_0$. FIG. 5 represents the partition tree of the 8-D constellation $(A_0)^8$ where $A_0$ is the one-dimension (1-D) 4-AM constellation.

The set $(A_0)^8$ has $do^2$ for the (squared) minimum Euclidian distance. This set is divided into 2 sub-sets having a minimum distance of $2do^2$. To each sub-set is allocated a bit $Y_0$ having the 0 or 1 value.

$Y_0=0$ for the sub-set formed by all the blocks belonging to $B_{i1}, \ldots, B_{i8}$ with $$\sum_{k=1}^{8} i_k = 0 \; mod2;$$

$Y_0=1$ for the sub-set formed by all the blocks belonging to $B_{i1} \ldots B_{i8}$ with $$\sum_{k=1}^{8} i_k = 1 \; mod2$$

Thus, $Y_0=0$ corresponds to the set of all the 4-AM symbol blocks $(U_1 \ldots U_8)$ containing an odd number of components in the 1-D sub-set, that is $B_1=\{+1, -3\}$.

Similarly, $Y_0=1$ corresponds to the set of all the 4-AM symbol blocks $(U_1 \ldots U_8)$ containing an odd number of components in the 1-D sub-set, that is $B_1=\{-1, +3\}$.

Then, each 8-D sub-set is in its turn divided into 2 other 8-D sub-sets, and so on and so forth.

To each partition level is allocated one bit:

$Y_0$ is allocated to the first level;

$Y_1$ is allocated to the second level;

$Y_2$ is allocated to the third level;

$Y_3$ is allocated to the fourth level;

In the following will be described only the sub-sets corresponding to $Y_0 = 0$.

After the $4^{th}$ partition level, the 8 sub-sets:

$S_0, S_2, S_4, S_6, S_8, S_{10}, S_{12}, S_{14}$ ($S_i$, i even) are obtained.

The index i of a sub-set $S_i$ is the decimal value of 4 bits $Y_3, Y_2, Y_1, Y_0$, allocated to $S_i$.

Each sub-set has the form $U(B_{i1} \ldots B_{i8})$ (union of the sub-sets) and is defined by parity relations of the indices ($i_1, \ldots i_8$). The minimum (squared) distance in each sub-set $S_i$ is $4\text{-}do^2$. Each sub-set contains $2^{12}=4096$ blocks of 8 4-AM symbols.

Each sub-set $S_i$ contains 16 sub-sets $(B_{i1} \ldots B_{i8})$ and each sub-set $(B_{i1} \ldots B_{i8})$ contains $2^8=256$ 8-D blocks.

Finally, each sub-set $S_i$ is divided into 2 sub-sets $S_{i,0}$ and $S_{i,1}$, where:

$S_{i,0}$ is the sub-set of the blocks of $S_i$ of which the last 4-AM symbol of the block is positive (thus belonging to $C_0$ or $C_1$).

$S_{i,1}$ is the sub-set of the blocks $S_i$ of which the last 4-AM symbol of the block is negative (thus belonging to $C_2$ or $C_3$).

Thus, $S_{i,0}$ corresponds to the set of the 8-D blocks of $S_i$ of which the last symbol $U_8$ is in $C_0$ or $C_1$, that is to say, that the last symbol corresponds to the bit $j_8=0$. $S_{i,0}$ contains $2^{11}$ elements.

$S_{i,1} = \{(U_1, \ldots U_8)$ of $S_i$, so that $j_8=1\}$.

For example, the sub-set $S_{6,1}$ is defined by the set of the blocks $(U_1, U_2, \ldots U_8)$ of $(A_0)^8$ verifying $j_8=1$ and the 4 parity relations of the bits $i_1$ to $i_8$:

$$i_1 \oplus i_3 \oplus i_5 \oplus i_7 = 0,$$

$$i_1 \oplus i_2 \oplus i_5 \oplus i_6 = 1,$$

$$i_1 \oplus i_2 \oplus i_3 \oplus i_4 = 1,$$

$$\sum_{p=1}^{8} i_p = 0$$

where $(i_p, j_p)$ are the bits allocated to the 4-AM symbol $U_p$ (FIG. 8).

In the general case, for even i, $S_{i,j}$ is the set of the blocks $U=(U_1, \ldots, U_8)$ of 4-AM symbols verifying the following parity relations $$i_1 \oplus i_3 \oplus i_5 \oplus i_7 = Y_3$$

$$i_1 \oplus i_2 \oplus i_5 \oplus i_6 = Y_2$$

$$i_1 \oplus i_2 \oplus i_3 \oplus i_4 = Y_1$$

$$i_1 \oplus i_2 \oplus i_3 \oplus i_4 \oplus i_5 \oplus i_6 \oplus i_7 \oplus i_8 = Y_0 = 0$$

$$j_8 = j$$

where $(Y_3 \ Y_2 \ Y_1 \ Y_0)$ is the bit representation of i, that is to say:
$i = 8Y_3 + 4Y_2 + 2Y_1 + Y_0$, with $Y_0 = 0$ and $(i_p, j_p)$ is the bit allocation of the $p^{th}$ symbol of the block $U_p$:

$$: \begin{cases} i_p = 0 \: si \: U_p = 3 \: ou -1 \\ i_p = 1 \: si \: U_p = 1 \: ou -3 \end{cases}$$

$$\begin{cases} j_p = 0 \: si \: U_p = 1 \: ou \: 3 \\ j_p = 1 \: si \: U_p = -1 \: ou -3 \end{cases}$$

Thus, for generating all the $S_{i,j}$ blocks ($2^{11}$ blocks), it is sufficient to scan all the possible combinations of the 11 bits $i_1, i_2, i_3, i_5, j_1, j_2, j_3, j_4, j_5, j_6$ and $j_7$. For a given combination, the other bits ($i_4, i_6, i_7, i_8, j_8$) are computed based on the parity relations of the sub-set $S_{i,j}$ defined above.

The systematic ⅞-rate convolution code is formed in the following manner:

The sub-sets $S_{i,j}$ are allocated to the parallel branches of the trellis. Moreover, the sub-sets $S_{i,j}$ with even i are utilized. This ensures a minimum distance (squared) equal to $4do^2$ where do is the minimum distance of the 4-AM constellation.

For having a code with a rate ⅞, there must be 8 separate transitions coming from a given state of the coder, which corresponds to 14 input bits (of which 3 coded bits and 11 non-coded bits) for 8 transmitted 4-AM symbols (that is, 16 bits). Consequently, the trellis of an 8-state code is connected completely.

For having a systematic code, that is, for providing that the transmitted 7 first 4-AM symbols of the 8-D block are the 7 data symbols (or 14 bits), it is necessary for the $2^{14}$ transitions based on a state to generate $2^{14}$ blocks of 8 4-AM symbols, the 7 first ones employing the $2^{14}$ possible combinations. Therefore, it is sufficient to allocate 8 sub-sets $S_{i,j}$, where i=0, 2, 4, 6, 8, 10, 12, 14 and j is an arbitrary value, to the 8 separate branches coming from one state.

Figure 6:
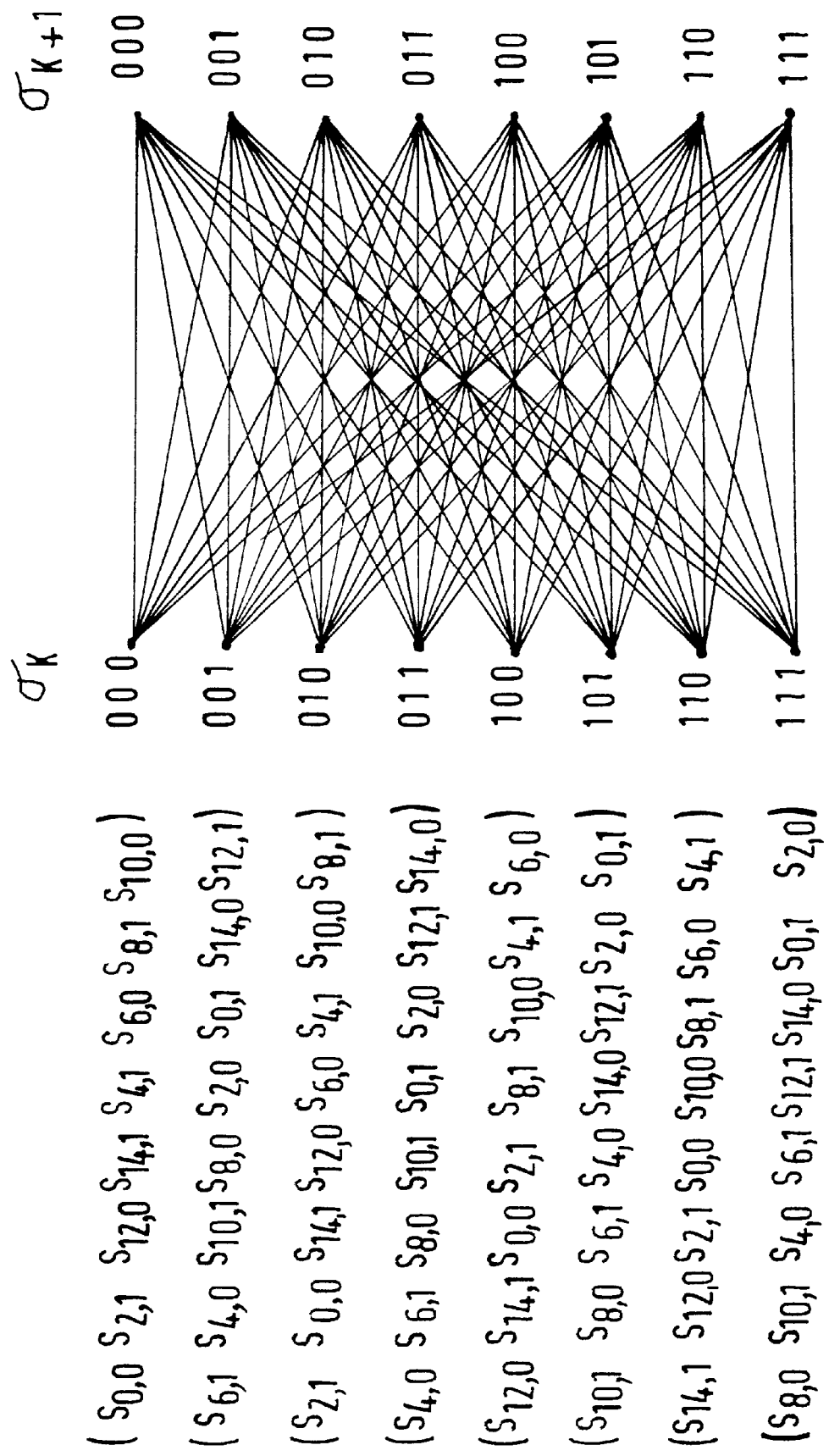
FIG. 6: gives a representation of the trellis of a code of rate ⅞.

FIG. 6 shows the trellis of the optimum ⅞ systematic convolutional code. In this Figure, $\sigma_k$ is the state of the coder at the instant k and $\sigma_{k+1}$ is the state of the coder at the instant k+1, the state being defined by the 3 bits in the memory of the coder (3 shift registers). This Figure also shows the allocation of the sub-sets $S_{i,j}$ to the various trellis transitions. The trellis is analyzed in the following manner:

Based on the state $\sigma(k)$ at the instant kt:
$\sigma_k = (\sigma_k^2, \sigma_k^1, \sigma_k^0)$, the coder proceeds to another state $\sigma(k+1)$ at an instant $(k+1)T$: $\sigma_{k+1} = (\sigma_{k+1}^2, \sigma_{k+1}^1, \sigma_{k+1}^0)$.

Thus from the state [111] the coder can go over to one of the 8 states [000][001][010][011][100][101][110][111].

For example, it is observed that the third transition coming from the state 001, that is to say, the transition 001→010, corresponds to $S_{10,1}$. The whole trellis is analyzed in like manner.

Figure 7:
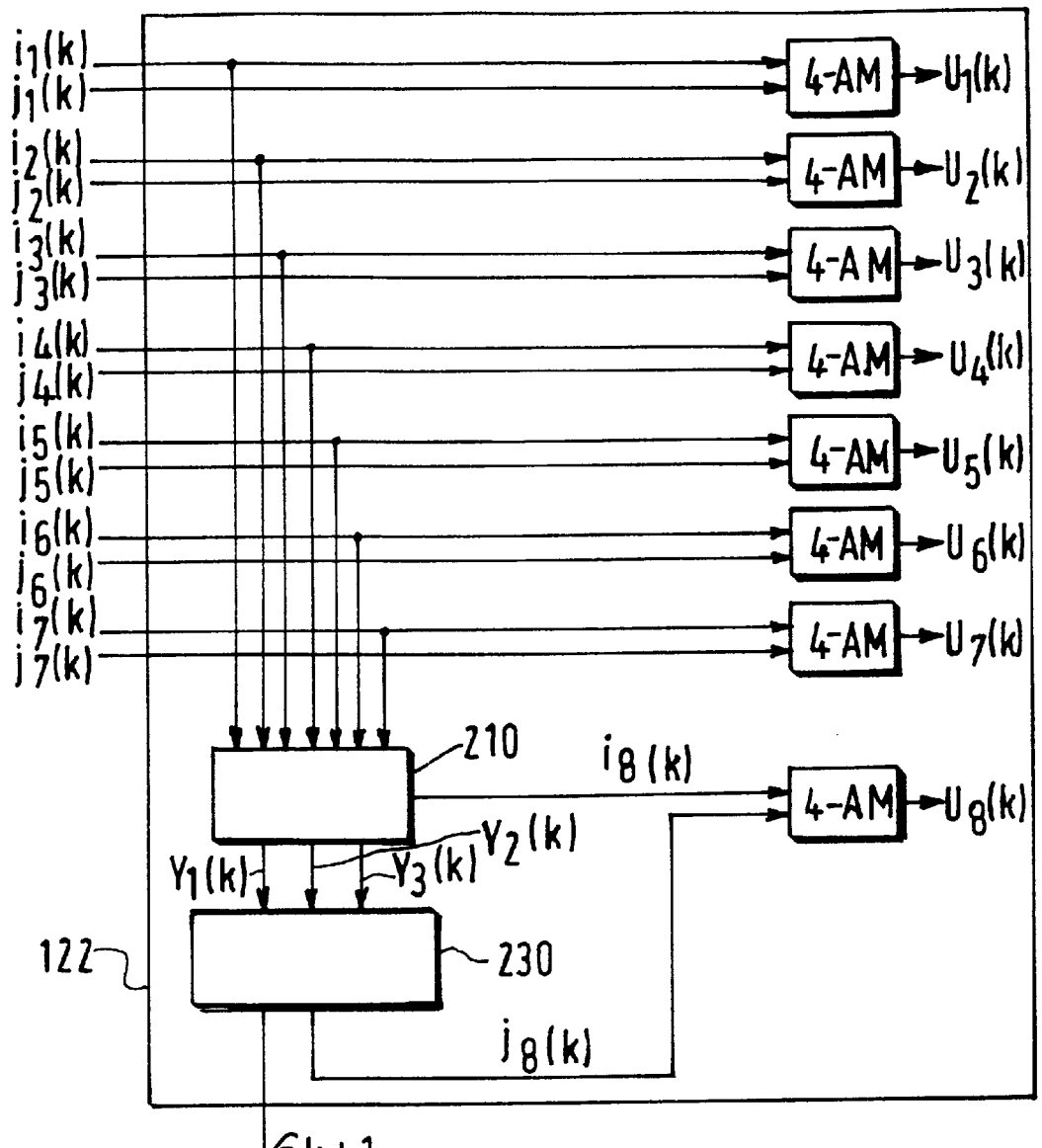
FIG. 7: shows a general circuit diagram of a systematic convolutional coder of rate ⅞ combined with a 4-AM 8-D modulation.

FIG. 7 shows the block diagram of the coder 122 of rate ⅞ (FIG. 3). The 14 bits on the input of the coder at the instant k, $(i_l(k), j_l(k)$ $l=1 \ldots 7$, select the 7 first symbols of the transmitted block $U_1(k), \ldots U_7(k)$ as shown in FIG. 8. For computing the redundancy symbol $U_8(k)$, that is, $(i_8(k), j_8(k))$, first the index i (even i) of the sub-set $S_i$ is computed which corresponds in like manner to the 3 bits $Y_3(k), Y_2(k), Y_1(k)$ with $i=8Y_3+4Y_2+2Y_1+Y_0$, $Y_0=0$. Also $i_8(k)$ is computed, which is the parity bit of the bits $i_1(k), \ldots i_7(k)$. The bit $j_8(k)$ is the redundancy bit of a systematic convolutional coder 230 of rate ¾ having for its inputs the bits $Y_1$, $Y_2$, and $Y_3$. The bits $(i_8, j_8)$ select the symbol $U_8(k)$. On the ¾ code output one has the next state of the coder $\sigma_{k+1}$ which will be used for closing the trellis at the end of a row or of a column (k=N).

The computation of the bits $Y_1(k), Y_2(k), Y_3(k)$ and $i_8(k)$ as a function of the bits $i_1(k), i_2(k), \ldots i_7(k)$ is given by the following equations:

$$Y_1(k) = i_1(k) \oplus i_2(k) \oplus i_3(k) \oplus i_4(k)$$

$$Y_2(k) = i_1(k) \oplus i_2(k) \oplus i_5(k) \oplus i_6(k)$$

$$Y_3(k) = i_1(k) \oplus i_3(k) \oplus i_5(k) \oplus i_7(k)$$

$$i_8(k) = i_1(k) \oplus i_2(k) \oplus i_3(k) \oplus i_4(k) \oplus i_5(k) \oplus i_6(k) \oplus i_7(k)$$

These equations are derived from the bit allocation of the sub-sets $S_i$ to the bits $Y_0, Y_1, Y_2,$ and $Y_3$ (FIG. 5) which is realized in element 210.

This structure of the coder (FIG. 7) permits of allocating all the 8-D blocks of $S_{i,j8}$ with $i=8Y_3+4Y_2+2Y_1$ to the parallel transitions of the trellis from a state σ to another state.

The convolutional coder of FIG. 7 may be realized either via a Table (FIG. 11), or by shift registers (FIGS. 9 and 10), or by software of a computer.

Figure 11:
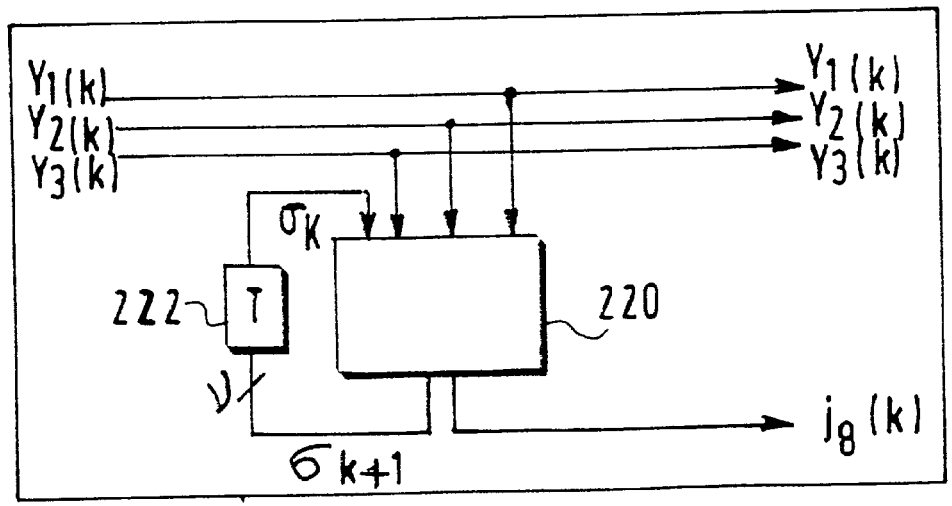
FIG. 11: shows a diagram of a particular embodiment of the coder represented in FIG. 7 for a code of rate ¾.

In FIG. 11, the Table 220 (memory) gives the redundancy bit $j_8(k)$ and the future state $\sigma_{k+1}$ (v bits for a code having $2^v$ states), as a function of $\sigma_k, Y_1(k), Y_2(k), Y_3(k)$. The Table 220 receives $Y_1, Y_2, Y_3$ and also its output $\sigma_{k+1}$ which is looped back to the input through a delay cell 222.

Figure 9:
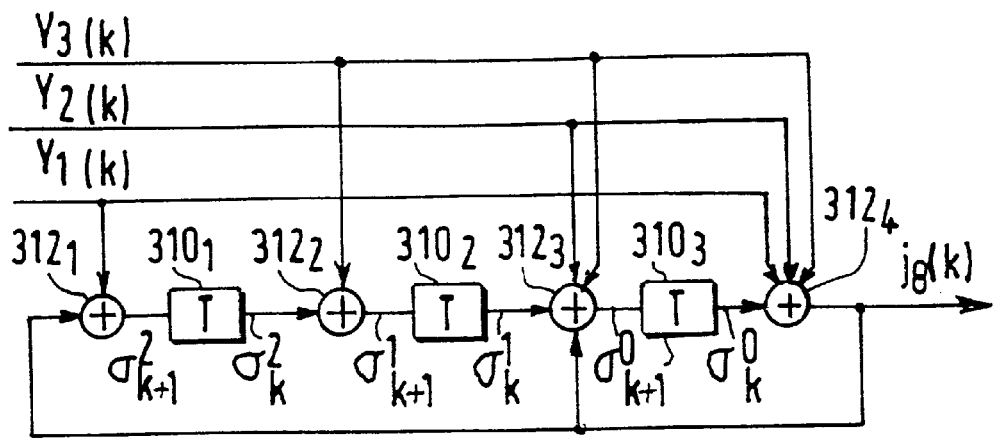
FIG. 9: represents a diagram showing a systematic convolutional coder for an 8-state code.
Figure 10:
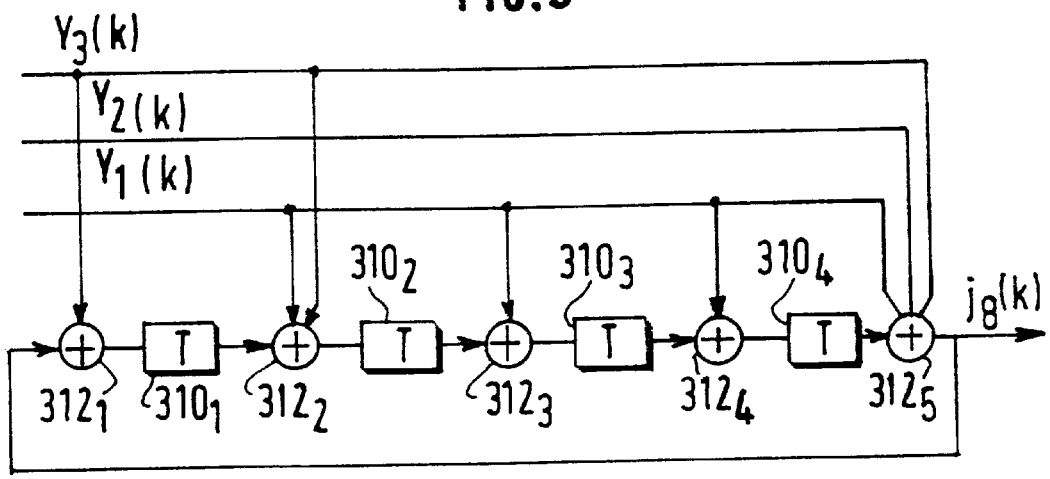
FIG. 10: represents a diagram showing a systematic convolutional coder for a 16-state code.

FIGS. 9 and 10 show the diagrams of the optimum, 8-state codes (v=3) and 16-state codes (v=4). For an 8-state code, a chain is formed by an adder cell $312_1$, a delay cell $310_1$, an adder cell $312_2$, a delay cell $310_2$, an adder cell $312_3$, a delay cell $310_3$, an adder cell $312_4$, while the output of the system produces $j_8(k)$.

The adder cell $312_1$ receives $Y_1(k)$,
The adder cell $312_2$ receives $Y_3(k)$,
The adder cell $312_3$ receives $Y_2(k)$ and $Y_3(k)$,
The adder cell $312_4$ receives $Y_1(k), Y_2(k)$ and $Y_3(k)$.

For a 16-state code (FIG. 10), a system is formed by the same elements as for the 8-state system with additionally a delay cell $310_4$ and an adder cell $312_5$.

Figure 12:
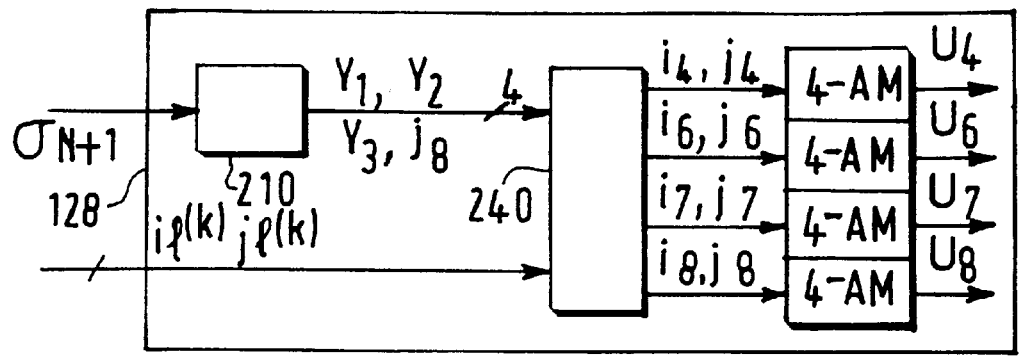
FIG. 12 shows a diagram for the computation of the trellis closing symbols.

FIG. 12 relates to the trellis closure arrangement. Let us consider the state σ of the coder and the sub-sets $S_{i,j8}$ (8-D sub-sets) allocated to the transition ($2^{11}$ parallel branches) closing the trellis.

$$i=8Y_3+4Y_2+2Y_1$$

As there are $2^{11}$ branches at which the trellis can be closed, one will look for the branch as a function of the 4 data symbols $U_1, U_2, U_3$ and $U_5$, that is, 8 information bits $i_1, j_1, i_2, j_2, i_3, j_3, i_5$ and $_5$.

During the closing transition of the trellis, 4 data symbols $U_1, U_2, U_3$ and $U_5$ are transmitted corresponding to the bits $(i_1,j_1), (i_2,j_2), (i_3,j_3)$ and $(i_5,j_5)$, respectively.

The computation is made in two steps (FIG. 12): Based on the state $\sigma_{N+1}$ of the coder at the end of the coding of a row or of a column, the bits $Y_1(N+1)$, $Y_2(N+1)$, $Y_3(N+1)$ and $j_8(N+1)$ are generated on the basis of the Table 210 which contains the Table III.

TABLE III

| σ(binary) ($\sigma^2$, $\sigma^1$, $\sigma^0$) | σ(decimal) | $S_{i,j8}$ | $Y_3\ Y_2\ Y_1$ | $j_8$ |
|---|---|---|---|---|
| 0 0 0 | 0 | $S_{0,0}$ | 0 0 0 | 0 |
| 0 0 1 | 1 | $S_{6,1}$ | 0 1 1 | 1 |
| 0 1 0 | 2 | $S_{2,1}$ | 0 0 1 | 1 |
| 0 1 1 | 3 | $S_{4,0}$ | 0 1 0 | 0 |
| 1 0 0 | 4 | $S_{12,0}$ | 1 1 0 | 0 |
| 1 0 1 | 5 | $S_{10,1}$ | 1 0 1 | 1 |
| 1 1 0 | 6 | $S_{14,1}$ | 1 1 1 | 1 |
| 1 1 1 | 7 | $S_{8,0}$ | 1 0 0 | 0 |

Based on the bits $Y_1(N+1)$, $Y_2(N+1)$, $Y_3(N+1)$ and $j_8(N+1)$, the bits $(i_4, j_4)$, $(i_6, j_6)$, $(i_7, j_7)$ and $(i_8, j_8)(N+1)$ are computed making it possible to generate the symbols $U_4(N+1)$, $U_6(N+1)$, $U_7(N+1)$ and $U_8(N+1)$ in computing means 240. These bits are computed via:

$$i_4(N+1) = i_1(N+1) \oplus i_2(N+1) \oplus i_3(N+1) \oplus Y_1(N+1)$$
$$i_6(N+1) = i_1(N+1) \oplus i_2(N+1) \oplus i_5(N+1) \oplus Y_2(N+1)$$
$$i_7(N+1) = i_1(N+1) \oplus i_3(N+1) \oplus i_5(N+1) \oplus Y_3(N+1)$$
$$i_8(N+1) = i_2(N+1) \oplus i_3(N+1) \oplus i_5(N+1) \oplus Y_1(N+1)Y_2(N+1) \oplus Y_3(N+1)$$

The bits $j_4$ and $j_6$ may assume whatever value. They are determined to be, for example, 0 ($j_4 = j_6 = 0$).

The bit $j_7$ is the parity bit of all the bits $(j_1, \ldots, j_7)$ of the preceding transitions:

$$j_7(N+1) = \sum_{k=1}^{N} \sum_{l=1}^{7} j_l(k) \oplus \sum_{l=1}^{6} j_l(N+1) \text{ This is}$$

This is effected in the computing means represented in FIG. 12. Preferably, the computations are realized via software of a computer.

The decoding means are shown in FIG. 1. The decoding is carried out in steps in two different stages. In the first stage an iterative decoding is carried out of the least-significant bits (LSB) of the transmitted symbols (bits i).

The matrix of the symbols received through the channel is stored in a memory 20, which matrix corresponds to the matrix of the transmitted symbols (the dimension of the matrix is the same as that of the matrix coded at the transmitter end).

The rows and after that the columns are successively decoded independently. With each iteration, the decision (connection $21_1$) on the bits i (bit matrix) is generated and a real-symbol matrix (reliability of the decision) which will be used during the next iteration is stored in the memory 20 (connection $23_1$). A de-interleaver $24_1$ delays the data.

For the decoding of a row and of a column, a soft-decision Viterbi decoder $22_1$ is used corresponding to the 8-D ⅞ convolutional code for the desired example.

In the second stage, after a certain number of iterations for the first step (generally 3 or 4), one proceeds to step 2 (connection 25) for decoding the bits j, that is to say, the most-significant bits (MSB) of the transmitted symbols.

Rows and after that columns are then iteratively decoded in that the real-symbol matrix stored in memory 20 and the matrix of the bits i detected in the first stage are used.

The decoder $22_2$ of a row or of a column is a soft-decision decoder of the parity code used when the trellis of the ⅞ convolutional code is closed for each row and column of the product code.

Figure 13:
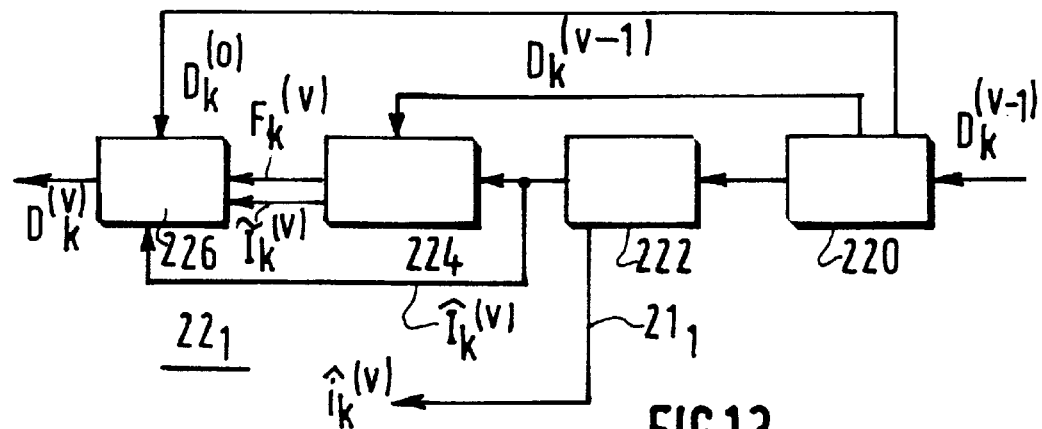
FIG. 13 shows a diagram of the decoding means of the first stage according to the invention.

First, consider the operation of the first stage (path 1). FIG. 13 represents the general circuit diagram of a stage comprising the means that double-decision Viterbi decoding means $22_1$ for the LSB bits of the transmitted 4-AM symbols (bits i). They comprise:

a sub-set 220 for computing matrices, a Viterbi decoder 222 which produces hard decisions, a sub-set 224 for computing the reliability of the decisions, a sub-set 226 for computing soft decisions.

The decoding of systematic convolutional codes consists of applying a soft-decision decoding algorithm. For simplicity of the exposition, the systematic convolutional code of rate ⅞ will be taken as an example. According to the particular example described for the row having index 1 in the Table I, a range of the product code is formed by the following symbols which have been transmitted at the transmitter end (for simplicity of the exposition, the row index, here i=1, is omitted in the following):

7N+4 data symbols:
$I = I_1, \ldots, I_{7N+4}$

N code redundancy symbols:
$R = R_1, \ldots, R_N$ 4 trellis closing symbols:
$TR = TR_1, TR_2, TR_3, TR_4$.

Because of the imperfections of the transmit channel, the received symbols $D^{(0)} = (D_1^{(0)}, \ldots, D_{8N+8}^{(0)})$ will present differences compared with the transmitted symbols.

At the receiver end, complex symbols are received which correspond to the transmitted 16-QAM symbols after passing through the channel. Each complex symbol is considered to be the sequence of 2 real symbols. Then, these real symbols are stored in the memory 20 (FIG. 1) in accordance with the matrix which has the same structure as the matrix defined at the transmitter end. The received real symbols are arranged in the matrix while adhering to the same order as that used at the transmitter end. The decoding process of the bits i is iterative, which means that the rows of the matrix are decoded first and then the columns. The number of rows or columns to be decoded with each iteration is equal to 7N+4 in the case of Table I (without redundancy coding) or equal to 8N+8 in the case where the redundancy is coded (Table II).

First, let us consider the iterative decoding at the $v^{th}$ iteration for a row of the matrix, that is to say, a block of real symbols: $D^{(v-1)} = (D_1^{(v-1)}, \ldots, D_{8N+8}^{(v-1)})$. The index v is an integer corresponding to the number of the iteration. The decoding produces the block: $D^{(v)} = (D_1^{(v)}, \ldots, D_{8N+8}^{(v)})$ of 8N+8 real symbols (soft output) which will be applied to the next iteration and to the optimum decision of the bits $\hat{i}^{(v)} = (\hat{i}_1^{(v)}, \ldots, \hat{i}_{8N+8}^{(v)})$ corresponding to the transmitted bits $i = (i_1, \ldots, i_{8N+8})$ which are the bits of the first partition level (LSB bits) of the transmitted 4-AM symbols $(I_1, \ldots, I_{7N+4}, R_1, \ldots R_N, TR_1, \ldots TR_4)$, respectively. It is supposed that the 7N+4 symbols $D_1^{(v-1)}, \ldots, D_{7N+4}^{(v-1)}$ correspond to the data symbols, and the N symbols $D_{7N+5}^{(v-1)}, \ldots, D_{8N+4}^{(v-1)}$ correspond to the ⅞ code redundancy symbols and the 4 symbols $D_{8N+5}^{(v-1)}, \ldots, D_{8N+8}^{(v-1)}$ are the redundancy symbols for closing the trellis. The symbols are processed in the following order:

$D_1^{(v-1)}, \ldots D_7^{(v-1)}, D_{7N+5}^{v-1};$ $D_8^{(v-1)}, \ldots D_{14}^{(v-1)}, D_{7N+6}^{(v-1)};$

...

$D_{7N-6}^{(v-1)}, \ldots D_{7N}^{(v-1)}, D_{8N+4}^{(v-1)};$ $D_{7N+1}^{(v-1)}, \ldots D_{7N+4}^{(v-1)}, D_{8N+5}^{(v-1)}; \ldots D_{8N+8}^{(v-1)}.$ The decoding is performed in six steps. The following exposition indicates the manner in which $D^{(v)}$ is derived from $D^{(v-1)}$.

The first step relates to the computation of the metrics. The sub-set 220 for computing the metrics (FIG. 13) carries out for each block of 8 symbols (1$^{st}$ block, l=0, . . . N−1) ($D_{7l+1}^{(v-1)}, - - - D_{7l+7}^{(v-1)}, D_{7N+5+l}^{(v-1)}$) the detection and the computation of metrics in each 8-D sub-set $S_{i,j}$, and for the block ($D_{7N+1}^{(v-1)}, - - - D_{7N+4}^{(v-1)}, D_{8N+5}^{(v-1)}, \ldots D_{8N+8}^{(v-1)}$) corresponding to the transition that closes the trellis at the end of the coding of a row or of a column of the product code. For simplicity, the 8-D block is denoted ($r_1, - - - r_8$). The computation of the metrics is carried out in various steps.

First consider the computation of the metrics in the 1-D constellation. For k=1, . . . 7 (the first 7 symbols of the block), the nearest 4-AM symbol is detected in each of the sub-sets $B_0$={3, −1} and $B_1$={1,−3} and the corresponding metric is computed: $M_{k,0}$ and $M_{k,1}$, respectively, where $M_{k,i}$ is equal to the squared Euclidian distance between $r_k$ and the nearest symbol in $B_i$.

For k=8, the metrics $M_{8,0}$, $M_{8,1}$, $M_{8,2}$ and $M_{8,3}$ of the symbol $r_8$ in each sub-set $C_i$ are computed, with Ci=0, 1, 2, 3, respectively, where $C_i$ contains the 4-AM point corresponding to the value i in decimal form of the 2 bits allocated to the 4-AM constellation.

Thereafter, the metrics are computed in the 2-D constellation. For the 3 first 2-D blocks (symbol pairs), that is, ($r_1$, $r_2$) ($r_3$, $r_4$) and ($r_5$, $r_6$), the metrics $M_{k,l}^{(2)}$ for k=1, 3, 5 are detected and computed in the 4 2-D sub-sets $E_l^{(2)}=B_iB_{i'}$ with l=2i+i', i=0, 1 and i'=0, 1.

The 2-D metric is defined as being the sum of the 2 1-D metrics of the 2 symbols of 2-D block. The metric of ($r_k$, $r_{k+1}$) in $E_l^{(2)}$ is obtained for k=1, 3, 5:

$$M_{k,l}^{(2)}=M_{k,i}+M_{k+1,i'}$$

for l=0, 1, 2, 3
with l=2i+i'.

For the last 2-D block $r_7$, $r_8$, the metrics $M_{7,l,j}^{(2)}$ are computed in the 8 2-D sub-sets $E_{l,j}^{(2)}=B_i\,C_{2j+i'}$ for i=0, 1, i'=0, 1, j=0, 1 with l=2i+i':

$$M_{7,l,j}^{(2)}=M_{7,i}+M_{8,2j+i'}$$

Thereafter, the metrics are computed in the 4-D constellation. The metrics $M_{1,l}^{(4)}$ are detected and computed of the 4-D block ($r_1\,r_2\,r_3\,r_4$) in the 8 four-dimension sub-sets $E_l^{(4)}$, with l=0, 1, . . . 7:

$E_0^{(4)}=E_0^{(2)}E_0^{(2)}\cup E_3^{(2)}E_3^{(2)}$ $E_1^{(4)}=E_0^{(2)}E_1^{(2)}\cup E_3^{(2)}E_2^{(2)}$ $E_2^{(4)}=E_0^{(2)}E_2^{(2)}\cup E_3^{(2)}E_1^{(2)}$ $E_3^{(4)}=E_0^{(2)}E_3^{(2)}\cup E_3^{(2)}E_0^{(2)}$ $E_4^{(4)}=E_1^{(2)}E_0^{(2)}\cup E_2^{(2)}E_3^{(2)}$ $E_5^{(4)}=E_1^{(2)}E_1^{(2)}\cup E_2^{(2)}E_2^{(2)}$ $E_6^{(4)}=E_1^{(2)}E_2^{(2)}\cup E_2^{(2)}E_1^{(2)}$ $E_7^{(4)}=E_1^{(2)}E_3^{(2)}\cup E_2^{(2)}E_0^{(2)}$ For each sub-set 2 4-D metrics are computed and the smaller metric is taken. For example, for $E_0^{(4)}$ is computed:

the metric $M_{1,3}^{(2)}+M_{3,3}^{(2)}$ in $E_3^{(2)}E_3^{(2)}$;

the metric $M_{1,3}^{(2)}+M_{3,3}^{(2)}$ in $E_3^{(2)}E_3^{(2)}$;

the metric $M_{1,0}^{(4)}$ in $E_0^{(4)}$ of ($r_1\,r_2\,r_3\,R_4$), equal to:

$$\min[M_{1,0}^{(2)}+M_{3,0}^{(2)}, M_{1,3}^{(2)}+M_{3,3}^{(2)}].$$

For the block ($r_5\,r_6\,r_7\,r_8$), the metrics $M_{5,l,j}^{(4)}$ in the sub-sets $E_{l,j}^{(4)}$ for l=0,1, . . . 7 and j=0,1 are detected and computed. The sub-sets $E_{l,j}^{(4)}$ are defined in similar fashion to $E_l^{(4)}$ except that the last symbol is positive for j=0 and is negative for j=1. For example, $E_{0,j}^{(4)}=E_0^{(2)}E_{0,j}^{(2)}\cup E_3^{(2)}E_{3,j}^{(2)}$. Thus it is sufficient to replace the index k of the second 2-D sub-set by k,j. The metric in $E_{0,j}^{(4)}$ is:

$$M_{5,0,j}^{(4)}=\min[M_{5,0}^{(2)}+M_{7,0,j}^{(2)}, M_{5,3}^{(2)}+M_{7,3,j}^{(2)}].$$

Finally, the metrics are computed in the 16 8-D sub-sets. The sub-set $S_{i,j}$ for even i is the union of the 4 8-D sub-sets, each being the concatenation of 2 4-D sub-sets:
$S_{i,j}=\cup\,E_l^{(4)}E_{l',j}^{(4)}$ with $i_2$=0,1 and $i_3$=0,1
and:

$i=8Y_3+4Y_2+2Y_1;$ $l=4i_2+2i_3+i_4;$ $l'=4i_6+2i_7+i_8;$ $i_4=i_2\oplus i_3\oplus Y_1$ $i_6=i_2\oplus Y_2$ $i_7=i_3\oplus Y_3$ $i_8=i_2\oplus i_3\oplus i_4\oplus i_6\oplus i_7.$ The computation of the metric of $r_1\ldots r_8$ in $S_{i,j}$ makes it necessary to compute metrics in the 4 8-D sub-sets $E_l^{(4)}E_{l',j}^{(4)}$ (Sum of the metric of ($r_1\,r_2\,r_3\,r_4$) in $E_l^{(4)}$ and that of ($r_5\,r_6\,r_7\,r_8$) in $E_{l',j}^{(4)}$). The minimum of the 4 metrics gives the 8-D metric in $S_{i,j}$, $M_{i,j}^{(8)}$.

For each 8-D block, the metrics in each sub-set $S_{i,j}$ are detected and computed, which metrics will be fed to the Viterbi decoder. These metrics are also the metrics of the trellis branches during the transitions 1, 2, . . . ,N+1.

Still in the first stage, the second decoding step is carried out. The sub-set 222 carries out a conventional Viterbi decoding of the received symbol sequences. In this manner is obtained the decoded optimum sequence (hard decision) of the row:

$\hat{I}^{(v)}=\hat{I}_1^{(v)}, \ldots \hat{I}_{7N+4}^{(v)}, \hat{I}_{7N+5}^{(v)}, \ldots \hat{I}_{8N+8}^{(v)}$ and the decoded LSB bit sequence:

$\hat{i}^{(v)}=\hat{i}_1^{(v)}, \ldots \hat{i}_{8N+8}^{(v)}$ and the sequence of the corresponding 8-D sub-sets.

The sequence of the states which correspond to the decoded states is:

$\hat{\sigma}^{(i)}=\hat{\sigma}_0^{(i)}, \ldots \hat{\sigma}_{N+1}^{(i)}$ which corresponds to N+1 transitions or branches, with $\hat{\sigma}_0^{(i)}=\hat{\sigma}_{N+1}^{(i)}=0$ which are the initial and final zero states. The vector of the state metric $M_j^{(i)}(\sigma)$ is stored for each state $\sigma=0, \ldots 7$ and for each instant $j=1, \ldots N+1$. Finally, the surviving paths in a Table are stored. All these results produced by the Viterbi decoder 222 are used for computing the reliability.

During the third step, the reliability of each symbol $\hat{I}_k^{(v)}$ or of each bit $\hat{i}_k^{(v)}$ of the decoded sequence $\hat{I}^{(v)}$ with $k=1, \ldots 8N+8$ is computed in the sub-set 224. The reliability features the quality of the decoded symbols (probability of exactness). This reliability may be written as:

$$F^{(i)} = F_1^{(i)}, \ldots F_{8N+8}^{(i)}.$$

The reliability of a symbol of the $k^{th}$ order is written as:

$$F_k^{(v)} = \log \left[ \frac{\sum_{C(\hat{I}^{(v)})} Prob(D^{(v-1)} \mid C)}{Prob(D^{(v-1)} \mid \hat{I}^{(v)})} \right]$$

where $D^{(v-1)}$ is the sequence of input symbols and where $C(\hat{I}_k^{(v)})$ is the set of codewords corresponding to a 4-AM symbol near to $\hat{I}_k^{(v)}$. The reliability $F_k^{(v)}$ may be written as:

$$F_k^{(v)} = \log \left[ \sum_{c(\hat{I}_k^{(v)})} \exp \frac{d^2(D^{(v-1)}, \hat{I}^{(v)}) - d^2(D^{(v-1)}, C)}{N_0} \right].$$

By taking the main term of the sum, one may write:

$$F_k^{(v)} \simeq \min_{C(\hat{I}_k^{(v)})} [d^2(C, D^{(v-1)}) - d^2(\hat{I}^{(v)}, D^{(v-1)})].$$

This minimum gives maximum correspondence with the error path producing a decoded 4-AM symbol which is near to the symbol $\hat{I}_k^{(v)}$. This definition of the reliability is also that of the bits $\hat{i}_k^{(v)}$. In fact, a symbol near to $\hat{I}_k^{(v)}$ corresponds to a bit $i$ which is the complement of $\hat{i}_k^{(v)}$.

The computation of the reliability takes place according to the following algorithm.

The sequence $\hat{I}_k^{(v)}$ decoded by the Viterbi decoder corresponds to a path in the trellis having a length of $N+1$. The computation algorithm for computing the reliability $F_k^{(v)}$ of the decision $\hat{I}_k^{(v)}$ for $k=1, \ldots 8N+8$ is the following:

The reliability of the decision $\hat{I}_k^{(v)}$ for $k=1, --- 8N+8$, or of the bit $\hat{i}_k^{(v)}$ for $k=1, --- 8N+8$ is carried out in 2 steps. The first step consists of computing the reliability compared with the error paths that correspond to the parallel transitions, and the second step consists of computing the reliability compared with error paths of the trellis. The final reliability is the lower of the two.

First the reliability FP due to the parallel branches is computed. The processing is carried out block by block on the symbol sequence $D_k^{(v-1)}$ and $\hat{I}_k^{(v)}$. Each processing makes it possible to compute the reliabilities due to parallel branches of the 8 symbols $(D_{7l+1}^{(v-1)}, ----, D_{7l+7}^{(v-1)}, D_{7N+5+l}^{(v-1)})$ which corresponds to the $1^{st}$ transition $(l=0, \ldots, N-1)$ and the 8 symbols $(D_{7N+1}^{(v-1)}, ----, D_{7N+4}^{(v-1)}, D_{8N+5}^{(v-1)}, \ldots, D_{8N+8}^{(v-1)})$, which corresponds to the $(N+1)^{th}$ transition (the one that closes the trellis). as the parallel branches of the trellis are allocated to 8-D sub-sets $S_{i,j}$, this reliability is also the reliability of the decision $\hat{I}_k^{(v)}$ in the 8-D sub-set containing the decoded block which corresponds to $\hat{I}_k^{(v)}$ (the sequence of the decoded 8-D sub-sets is produced by the Viterbi decoder).

$S_i(r_1, \ldots r_8)$ is the block $(D_1^{(v-1)}, \ldots, D_7^{(v-1)}, D_{7N+5}^{(v-1)})$, for example, and $S_{i,j}$ the decoded 8-D sub-set corresponding to the detected 4-AM symbols $(d_1, \ldots d_8) = (\hat{I}_1^{(v)}, \ldots, \hat{I}_7^{(v)}, \hat{I}_{7N+5}^{(v)})$, it may be shown that the computation of the reliabilities $r_k$ (for $k=1, \ldots 8$) in $S_{i,j}$ boils down to computing the reliabilities of $(r_1, r_2, r_3, (1-2Y_1)r_4, r_5, (1-2Y_2)r_6, (1-2Y_3)r_7, (1-2(Y_1 \oplus Y_2 \oplus Y_3))r_8)$ in the sub-set $S_{o,j'}$ with $j' = j \oplus Y_1 \oplus Y_2 \oplus Y_3$, and $i = 8Y_3 + 4Y_2 + 2Y_1$. Thus, in all the cases this boils down to computing the reliabilities in $S_{0,0}$ or $S_{0,1}$, which makes the algorithm simpler.

Figure 14:
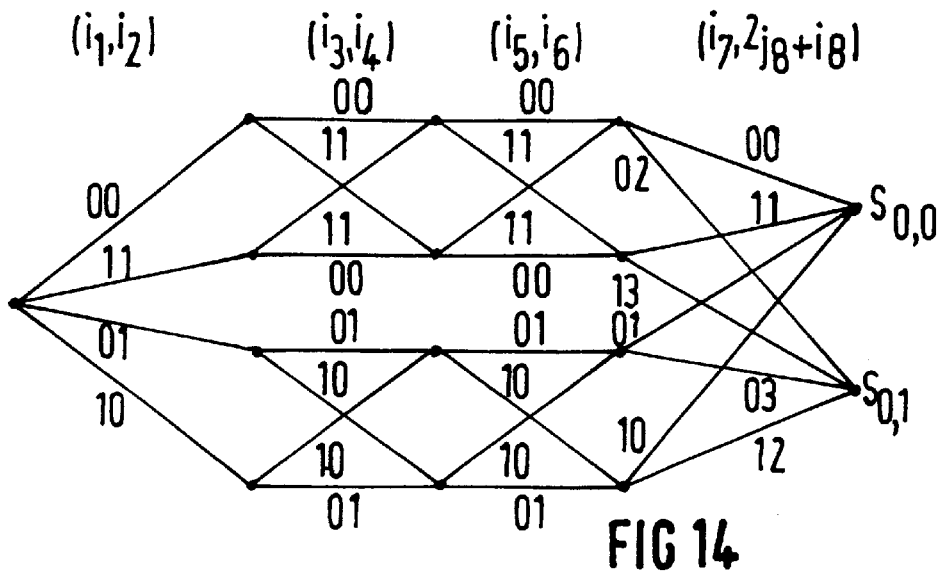
FIG. 14: gives a representation of a trellis of the sub-sets $S_{0,0}$ and $S_{0,1}$.

FIG. 14 gives a representation in a trellis of the sub-sets $S_{0,1}$ and $S_{0,1}$ where each path in the trellis corresponds to a sub-set having the form $B_{i1} B_{i2} \ldots B_{i7} C_{2j8+i8}$.

The algorithm for $S_{0,0}$ will be described, that is, $S_{i,j} = S_{0,0}$, for computing the reliabilities of the decision $d_k$ for $k=1, \ldots 8$:

First the computation of the 2-D metrics takes place:

$$M_{ij}(1) = M_{1,i} + M_{2,j} \quad i=0,1; j=0,1$$
$$M_{ij}(2) = M_{3,i} + M_{4,j} \quad i=0,1; j=0,1$$
$$M_{ij}(3) = M_{5,i} + M_{6,j} \quad i=0,1; j=0,1$$
$$M_{ij}(4) = M_{7,i} + M_{8,j} \quad i=0,1; j=0,1$$

where $M_{k,i}$ is the metric of $r_k$ in $B_i$ for $k=1, \ldots 7$; and
$M_{8,i}$ is the metric of $r_8$ in $C_i$.
In the case where the computation of the reliabilities is performed for $S_{0,1}$, $M_{8,i}$ is computed in $C_2$ and $C_3$ ($i=2, 3$).

Thus the nearest path from $(r_1, \ldots r_8)$ is sought in $S_{0,0}$:

The upper part and the lower part of the trellis of $S_{0,0}$ are considered separately. In the upper trellis is computed $M(0, k) = \min (M_{0,0}(k), M_{1,1}(k))$ for $k=1, 2, 3$ $$M(0,4) = \min (M_{0,0}(4), M_{1,1}(4)).$$

The bits $(i_1, \ldots i_8)$ giving the minimum value are stored, with $i_1 = i_2, i_3 = i_4, i_5 = i_6, i_7 = i_8$, in the Table $[i(0,1), \ldots i(0,8)]$ and:

$$MET(0) = \sum_{k=1}^{4} M(0,k)$$

is computed.

In the lower trellis, $M(1,k) = \min (M_{0,1}(k), M_{1,0}(k))$ is computed for $k=1,2,3$, $$M(1,4) = \min (M_{0,1}(4), M_{1,0}(4)).$$

$$MET(1) = \sum_{k=1}^{4} M(1,k)$$

The bits $i_1 \ldots i_8$ corresponding to the minimum in $[i(1,1), --- i(1,8)]$ with $i_1 = \bar{i}_2, i_3 = \bar{i}_4, i_5 = \bar{i}_6, i_7 = \bar{i}_8$ are stored.

There is verified whether the sequences $[i(0,1), \ldots i(0,8)]$ and $[i(1,1), \ldots i(1,8)]$ are two valid sequences. The parity bits $p(0)$ and $p(1)$ are computed for the sequences $[i(0,1), i(0,3), i(0,5), i(0,7)]$ and $[i(1,1), i(1,3), i(1,5), i(1,7)]$, respectively. For k=0, 1, if p(k)=0, the corresponding sequence belongs to the trellis (or $S_{0,0}$), if not the sequence will be modified.

Differences of 2-D metrics are computed:

$$\delta(0,k)=|M_{0,0}(k)-M_{1,1}(k)|, k=1, 2, 3$$

$$\delta(0,k)=|M_{0,0}(k)-M_{1,1}(k)|, k=4$$

$$\delta(1,k)=|M_{0,1}(k)-M_{1,0}(k)|, k=1, 2, 3$$

$$\delta(1,k)=|M_{0,1}(k)-M_{1,0}(k)|, k=4$$

Then the minimum of 4 metrics is computed for each of the two upper and lower trellises (q=0, 1, respectively):

$$\Delta(q) = k = 1^{\min}, \ldots 4 \quad \delta(q, k), q = 0, 1$$

The index k giving the minimum in $k_{min}(q)$ is stored and the second minimum $\Delta_2(q)$ is computed.

If the parity bit p(q)=1, the bits (i(q, 2 $k_{min}(q)$-1), i(q, 2$k_{min}(q)$)) are complemented and the metric MET (q) of $\Delta$(q) is incremented. This operation is carried out for q=0 (upper trellis) and q=1 (lower trellis).

Then $\Delta_{min}$=|MET(0)−MET(1)| is computed and the index c (0 or 1) is stored giving the lower value of MET(0) and MET(1).

The reliabilities FP(1), . . . ,FP(8) of ($d_1$, . . . $d_8$) are initialized in $S_{0,0}$:

$$FP(2k-1)=FP(2k)=\delta(c,k)+(1-2p(c)) \Delta(c) \text{ pour } K \neq K_{min} (c)$$

$$FP(2k-1)=FP(2k)=\Delta_2(c)+(1-2p(c)) \Delta(c) \text{ pour } k=k_{min} (c)$$

where FP(k) is the reliability of $d_k$ in $S_{0,0}$.

Thereafter, the reliabilities FP(k), k=1, . . . 8 are updated:

For k=1, . . . 8 with i(c,k)≠i (1−c, k):
  FP(k)=min [FP(k), $\Delta_{min}$]
For k=1, 2, 3, 4:
  FP(2k−1)=min [FP(2k−1), $A_k$]
  if i(0, 2k−1)=i(1, 2k−1)
FP(2k−1)=min [FP(2k), $A_k$] if i (0,2k)=i(1,2k)
with $$A_k=\Delta_{min}+\delta(1-c, k)+[1-2p(1-c)]\Delta (1-c) \text{ if } k \neq k_{min} (1-c)$$

$$A_k=\Delta_{min}+\Delta_2 (1-c)+[1-2p(1-c)]\Delta (1-c) \text{ if } k=k_{min} (1-c).$$

The reliability caused by the error paths of the trellis (FIG. 15) is determined. Consider the decoding of a row (step 300).

One starts from:

$\hat{I}_k^{(v)}$ which is the sequence of 4-AM symbols decoded by the Viterbi decoder for k=1, . . . 8N+8;

$M_k^{(v)}(\sigma)$=which is the metric of the state $\sigma$ at the instant k ($k^{th}$ transition) for k=1, . . . N+1.

Figure 15:
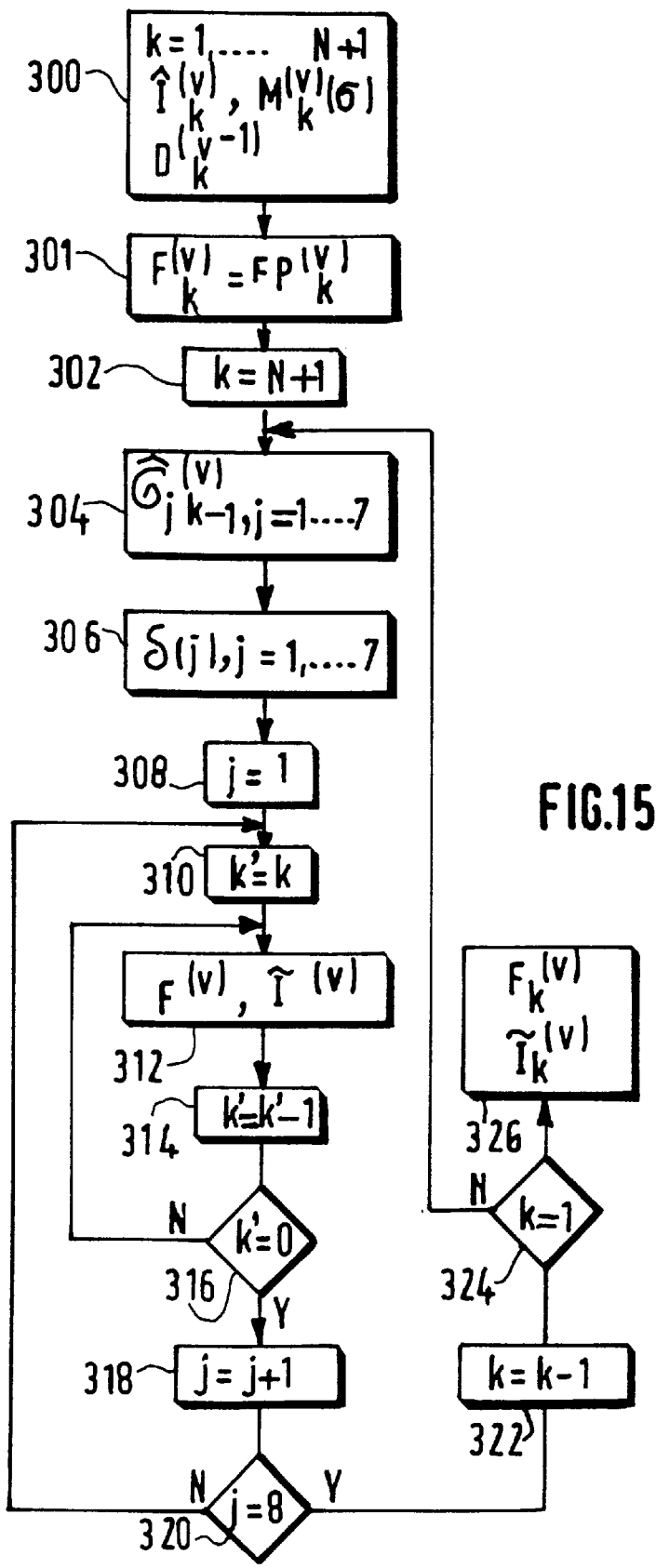
FIG. 15 shows a flow chart of the various steps of the decoding carried out in the first stage.

$D_k^{(v-1)}$ which are the input symbols (produced by the preceding iteration decoder) for k=1, . . . 8N+8, and the array of the reliabilities $F^{(v)}=(F_k^{(v)}, k=1, \ldots 8N+8)$ to $FP^{(v)}=(FP_k^{(v)}, k=1, \ldots 8N+8)$ or $FP_k^{(v)}$ is the reliability of $\hat{I}_k^{(v)}$ caused by the parallel transitions (step 301 in FIG. 15).

For k=N+1, . . . 2, where k corresponds to one instant (index of the transition), the following operations are carried out:

a) based on the state of the coder after the $k^{th}$ transition in the decoded path $\hat{\sigma}_k^{(v)}$, the state $\hat{\sigma}_{k-1}^{(v)}$ is determined after the (k−1)$^{th}$ transition of the decoded path and the 7 other precursor states of $\hat{\sigma}_k^{(v)}$, that is, $\sigma_{j,k-1}^{(v)}$, j=1 . . . 7 (step 304). Therefore, the values of $\hat{\sigma}_k^{(v)}$ for k varying from 1 to N+1 are produced by the Viterbi decoder, whereas the values of $\sigma_{j,k-1}^{(v)}$ may be stored in a memory.

Based on metrics of the states $\sigma_{1,k-1}^{(v)}$, $\sigma_{2,k-1}^{(v)}$, . . . $\sigma_{7,k-1}^{(v)}$ and $\hat{\sigma}_k^{(v)}$ computed and stored in the Viterbi decoder, for k=2, . . . N+1, and which are denoted $$M_{k-1}^{(v)}(\sigma_{1,k-1}^{(v)})$$
$$M_{k-1}^{(v)}(\sigma_{2,k-1}^{(v)})$$
$$\ldots$$
$$M_{k-1}^{(v)}(\sigma_{7,k-1}^{(v)})$$
$$M_k^{(v)}(\hat{\sigma}_k^{(v)})$$

the 7 cumulated metrics of the state $\hat{\sigma}_k^{(v)}$ are computed for the 7 paths coming from the 7 states $\sigma_{j,k-1}^{(v)}$, j=1, . . . 7. These 7 cumulated metrics are:

$\delta(j)=M_{k-1}^{(v)}(\sigma_{j,k-1}^{(v)})+\text{MET}(\sigma_{j,k-1}^{(v)} \to \hat{\sigma}_k^{(v)})$, where MET $(\sigma_{j,k-1}^{(v)} \to \hat{\sigma}_k^{(v)})$ is the metric of the transition from the state $\sigma_{j,k-1}^{(v)}$ to the state $\hat{\sigma}_k^{(v)}$ which is also the metric of the 8-D sub-set allocated to this transition. These metrics are stored in a memory during the Viterbi decoding (step 306).

The difference between the optimum metric and each of the cumulated metrics is computed:

$$\Delta(j)=\delta(j)-M_k^{(v)}(\hat{\sigma}_k^{(v)}), j=1, \ldots 7$$

where $M_k^{(v)}(\hat{\sigma}_k^{(v)})$ is the optimum metric of the state $\hat{\sigma}_k^{(v)}$.

Thereafter, the 7 surviving precursors to the state $\hat{\sigma}_k^{(v)}$ are examined. A step back is made to the survivor of the $j^{th}$ order, from $\hat{\sigma}_k^{(v)}$ to $\sigma_{j,k-1}^{(v)}$. Then each survivor of the $j^{th}$ order of the state $\sigma_{j,k-1}^{(v)}$ is examined until the initial state $\sigma$=0, which consists of making the index of the transition vary from k to 1.

To reduce the complexity, the 7 survivors of the state $\sigma_{j,k-1}^{(v)}$ may be examined up to the state of the survivor at the instant k−L instead of the instant 1, thus a fixed number of transitions. For L=3, the degradation of the performance is negligible.

The 8 4-AM symbols allocated the $k'^{th}$ transition of the survivor of the $j^{th}$ order are compared with the 8 decoded symbols for k' which varies from k to 1, or from k to (k−L) in the second case. If the decoded symbol and the symbol of the $k'^{th}$ transition of the survivor j of the same rank are adjacent, the reliability of the decoded symbol is replaced by $\Delta(j)$ if the latter is lower than this reliability (step 312).

The Table of the symbols $\tilde{I}_k^{(v)}$ which are adjacent $\hat{I}_k^{(v)}$, which corresponds to the minimum, for k varying from 1 to 8N+8, and, with each updating of the reliability of one symbol, its adjacent symbol is updated by replacing it by the corresponding 4-AM symbol which relates to the transition of the $k'^{th}$ order of the survivor j.

In the end, the reliabilities $F_k^{(v)}$ of the decoded symbol $\hat{I}_k^{(v)}$ and of the adjacent corresponding symbol $\tilde{I}_k^{(v)}$ for k=1, . . . 8N+8 (step 326) are obtained.

The reliability is thereafter normalized during the fourth step to allow of the computation of the soft decision $\tilde{D}_k^{(v)}$ for k=1, . . . 8N+8. Three methods can be used for computing the normalized reliability $F_k^{norm(v)}$. One may compute: either $$F_k^{norm(v)} = F_k^{(v)} / \bar{F}$$

or $$F_k^{norm(v)} = F_k^{(v)} + (1-\tilde{F})$$

or $$F_k^{norm(v)} = (F_k^{(v)}/\beta_1) + \beta_2$$

where $\bar{F}$ is equal to the average of $F_k^{(v)}$ computed of the whole reliability matrix, $\beta_1$ and $\beta_2$ being constants verifying $\bar{F} = \beta_1(1-\beta_2)$.

Subsequently, during the fifth step, soft- non-weighted decision are computed (sub-set 226, FIG. 13).

The soft decision $\tilde{D}_k^{(v)}$ is computed on the basis of the optimum decision $\hat{I}_k^{(v)}$ given by the Viterbi decoder, of its normalized reliability $F_k^{norm(v)}$ and of the sequence of the 4-AM symbols $\tilde{I}_k^{(v)}$ obtained previously. The 4-AM symbol $\tilde{I}_k^{(v)}$ is an adjacent symbol to the symbol $\hat{I}_k^{(v)}$, that is $|\tilde{I}_k^{(v)} - \hat{I}_k^{(v)}| = 2$. it corresponds to the 4-AM symbol which is most likely to occur after the symbol $\hat{I}_k^{(v)}$. The symbol $\tilde{D}_k^{(v)}$ is given by:

$$\tilde{D}_k^{(v)} = \tfrac{1}{2}(\hat{I}_k^{(v)} + \tilde{I}_k^{(v)}) + sgn(\hat{I}_k^{(v)} - \tilde{I}_k^{(v)}) F_k^{norm(v)}$$

where the function sgn is defined by:

$$sgn(x) = \begin{pmatrix} 1 \text{ if } x > 0 \\ 0 \text{ if } x = 0 \\ -1 \text{ if } x < 0 \end{pmatrix}.$$

Thus, the symbol $\tilde{D}_k^{(v)}$ corresponds to a symbol situated at the distance $F_k^{norm(v)}$ from the decision threshold between $\hat{I}_k^{(v)}$ and $\tilde{I}_k^{(v)}$. As $E(F_k^{norm(v)}) = 1$, the symbols $\tilde{D}_k^{(v)}$ will be centered around 4-AM symbols.

To improve performance, during a sixth step $\tilde{D}_k^{(v)}$ is weighted with the symbols $D_k^{(0)}$ received through the channel which are stored in the memory 20 for computing $D_k^{(v)}$:

$D_k^{(v)} = \alpha_v \tilde{D}_k^{(v)} + (1-\alpha_v)D_k^{(0)}$ where $\alpha_v$ is a weight factor. For example: $\alpha_1 = 0,6$; $\alpha_2 = 0,9$; $\alpha_v = 1$ for v greater than 1. The object is to reduce the effect of error propagation during the first iterations. The steps 5 and 6 are carried out together in the sub-set 226.

Secondly, consider the operation of the second stage (path 2) for the decoding of the bits j. The bits j, thus MSB bits of the 4-AM symbols are coded with the parity code applied to each row and each column of the matrix of the product code. This is realized when the trellis is closed. The decoding is an iterative decoding as for the bits i.

Figure 16:
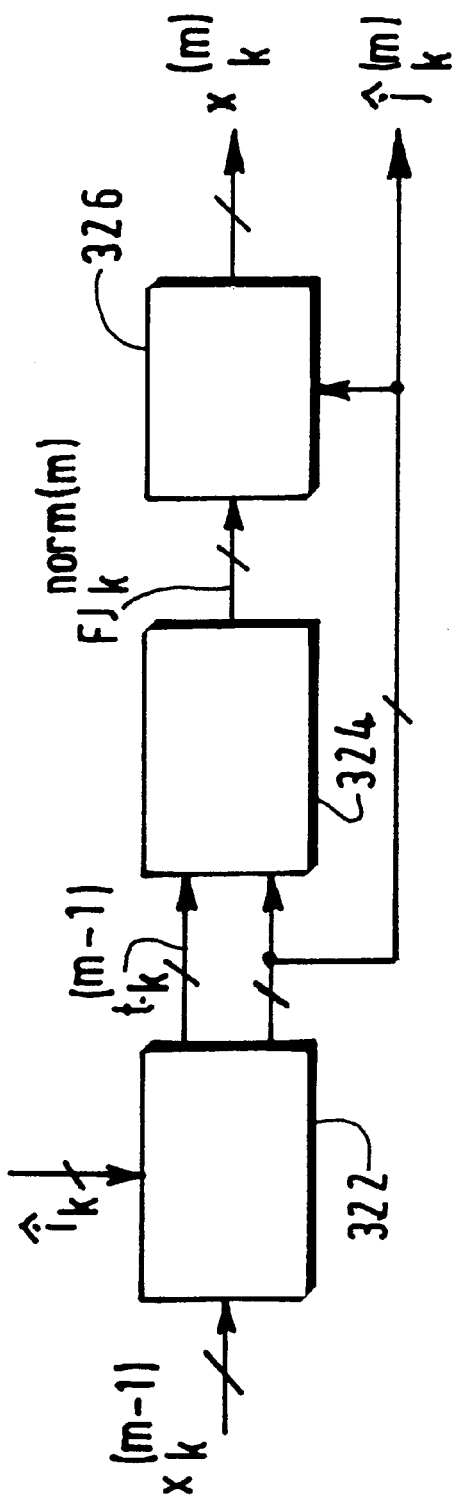
FIG. 16: shows a diagram of the decoding means of the second stage according to the invention.

FIG. 16 represents the general circuit diagram of a stage comprising decoding means $22_1$ for decoding the parity code of the MSB bits of the transmitted 4-AM symbols. They comprise:

- a decoder 322 for decoding the parity code which gives hard decisions;
- a sub-set 324 for computing the reliability of the decisions;
- a sub-set 326 for computing soft decisions.

For the first iteration (m=1), the symbols $x_k^{(0)}$ are the received symbols on the output of the channel, that is:

$(D_1^{(0)}, \ldots D_{7N+4}^{(0)}, D_{8N+5}, \ldots D_{8N+7}^{(0)})$.

Figure 17:
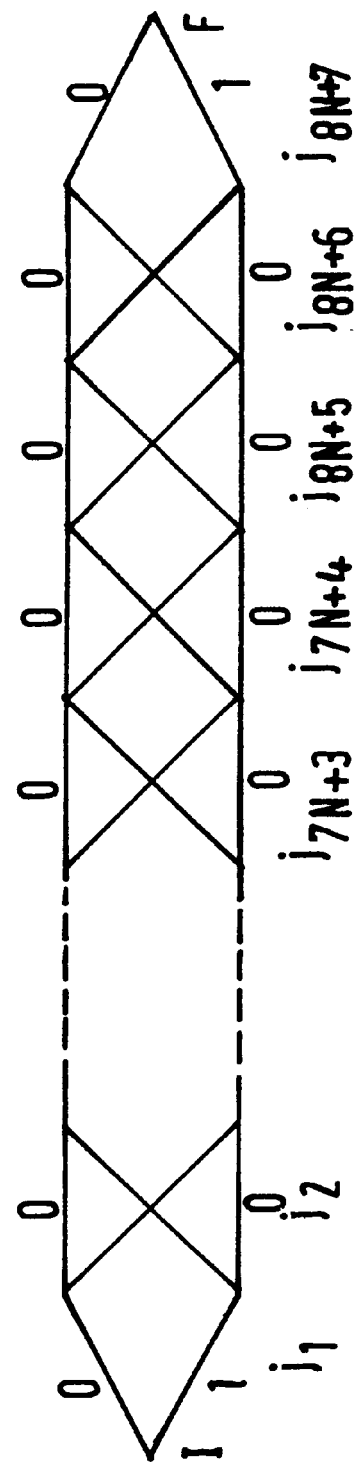
FIG. 17: gives a representation in a trellis of the parity code.

FIG. 17 gives a representation in a trellis of the 7N+7 bits $(j_1, \ldots j_{7N+4}, j_{8N+5}, j_{8N+6}, j_{8N+7})$ coded with the parity code. In this trellis, any path from point I to point F corresponds to a codeword having length 7N+7. The decoding of a block of 7N+7 symbols $x_k^{(m-1)}$ for the $m^{th}$ rank iteration is allocated in 3 steps.

During the first step (step 322), a hard decision decoding is made of $x_k^{(m-1)}$. A threshold decision is applied symbol by symbol to these symbols in the sub-set $B_{\hat{i}k}$, where $\hat{i}_k$ for k=1, ... 7N+4, 8N+5, 8N+6, 8N+7 is the sequence of the LSB bits of the 4-AM symbols estimated by the iterative decoding of the first stage after the convergence. This threshold decision produces a first bit estimate $\hat{j}_k^{(m)}$ with $\hat{j}_k^{(m)} = 0$ (1, respectively) if the decision in $B_{\hat{i}k}$ is positive (negative, respectively).

Subsequently, for each symbol $x_k^{(m-1)}$ is computed the absolute value of the distance $d(x_k^{(m-1)}, t_k^{(m-1)})$ separating this symbol from the decision threshold $t_k^{(m-1)}$ in the sub-set $B_{\hat{i}k}$, where the threshold in $B_0 = \{3,-1\}$ ($B_1 = \{1,-3\}$, respectively) is equal to +1 (-1, respectively) and the minimum $\Delta$ for k of the distance $d(x_k^{(m-1)}, t_k^{(m-1)})$ is computed and so is the second minimum $\Delta_2$.

Finally, the parity bit p of the bits $\hat{j}_k^{(m)}$ is computed. If the parity is satisfactory (p=0), the sequence of the bits $\hat{j}_k^{(m)}$ is the optimum sequence. If not, the bit $\hat{j}_{k_{min}}^{(m)}$ is complemented where $k_{min}$ is the index providing the minimum $\Delta$ of $d(x_k^{(m-1)}, t_k^{(m-1)})$.

During the second step, the computation of the reliabilities (step 324) is made. The reliability of the decision $\hat{j}_k^{(m)}$ is given by:

$$FJ_k^{(m)} = (1-2p)\Delta + d(x_k^{(m-1)}, t_k^{(m-1)}) \quad k \neq k_{min}$$

$$FJ_k^{(m)} = (1-2p)\Delta + \Delta 2, \quad k = k_{min}$$

Subsequently, the reliability is normalized according to:

$$FJ_k^{norm(m)} = FJ_k^{(m)} / \bar{FJ}$$

where $\bar{FJ}$ is the average of the reliabilities $FJ_k^{(m)}$.

During the third step, the computation of the soft decision $x_k^{(m)}$ is made (step 326). This decision is obtained as a function of $t_k^{(m)}, \hat{j}_k^{(m)}, FJ_k^{norm(m)}$ via:

$x_k^{(m)} = t_k^{(m)} + 2 \, sgn(1-2\hat{j}_k^{(m)}) \times FJ_k^{norm(m)}$ where sgn(.) is the sign function.

The invention has just been described in the case of a systematic convolutional code of rate ⅞. A person of ordinary skill in the art may apply the same coding and decoding principles to other systematic convolutional codes of rate P/(Q.M) combined with other multidimensional amplitude modulations having dimension Q and having $2^M$ states.

We claim:

1. A method of protecting input data implemented in a digital transmission system, the method comprising a coding phase for said data and an iterative decoding phase, the coding phase comprising a first step for performing a systematic convolutional trellis coding permitting of the iterative decoding combined with a second step for assigning the coded data to digitally modulated symbols, characterized in that during the first step the systematic trellis coding has a coding rate P/(Q.M), where M, P and Q are integers with Q and M being greater than 1, the systematic convolutional code being used for generating a product code in blocks with trellis closure by the addition of redundant data, the product code being formed by components generated by row coding and column coding of a matrix that combines the coded data via the systematic convolutional code, whereas the second step combines the product code with a multidimensional amplitude modulation having dimension Q that has $2^M$ states, the iterative decoding being a block decoding.

2. The method as claimed in claim 1, characterized in that the rate is equal to ⅞, the modulation being an 8-D modulation having 8 dimensions.

3. A digital transmission system with input data protection, comprising coding means of said data and iterative decoding means, the coding means comprising:

a first sub-set for performing a systematic convolutional trellis coding permitting of the iterative decoding and a second sub-set for assigning the coded data to digitally modulated symbols, characterized in that the first sub-set utilizes a systematic convolutional trellis coding having a coding rate P/(Q.M), where M, P and Q are integers with Q and M being greater than 1, the systematic convolutional code being used for generating a product code in blocks with trellis closure by the addition of redundant data which comprise at least one parity code bit, the product code being formed by components generated by row coding and column coding of a matrix that combines the coded data via the systematic convolutional code, whereas the second sub-set combines the product code with a multidimensional amplitude modulation having dimension Q that has $2^M$ states, the iterative decoding being a block decoding.

4. The system as claimed in claim 3, characterized in that the coding means comprise a means called state machine for defining successive states of the coder and producing the trellis closing redundancy symbols.

5. The system as claimed in claim 3, characterized in that the rate is equal to ⅞, the modulation being an 8-D modulation having 8 dimensions, the systematic convolutional coding means coding seven input symbols into eight output symbols by adding one redundancy bit.

6. The system as claimed in claim 5, characterized in that the systematic convolutional coding means comprise two shift-cell stages, the output symbols being obtained by linearly combining the data coming from the shift cells.

7. A system as claimed in claim 3, characterized in that the iterative decoding means comprise at least two paths operating in succession:

along a first path, the system carries out with each iteration of the path a first iterative decoding with:
a) computing means for computing hard decision which relate to the systematic convolutional code,
b) computing means for computing first reliabilities of the hard decisions associated with each multidimensional modulation sub-set, and second reliabilities associated to the trellis of the systematic convolutional code,
c) selecting means for selecting minimum reliabilities between the first and second reliabilities of each decision, and
d) computing means for computing soft decision used for the next iteration of the first path as a function of selected minimum reliabilities and hard decisions;

and along a second path, the system utilizes for each iteration of the path:
a) computing means for computing hard decisions which relate to the parity code,
b) computing means for computing third reliabilities for each hard decision of the second path as a function of hard decision of the first path, and
c) computing means for computing soft decisions as a function of the third reliabilities, soft decisions coming from the preceding iteration of the second path and hard decisions from the firth path.

* * * * *